United States Patent
Kaneko et al.

(10) Patent No.: US 8,306,646 B2
(45) Date of Patent: Nov. 6, 2012

(54) COATING AND DEVELOPING APPARATUS, COATING AND DEVELOPING METHOD, AND STORAGE MEDIUM

(75) Inventors: Tomohiro Kaneko, Koshi (JP); Takeshi Matsumoto, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 802 days.

(21) Appl. No.: 12/427,123

(22) Filed: Apr. 21, 2009

(65) Prior Publication Data

US 2009/0299515 A1    Dec. 3, 2009

(30) Foreign Application Priority Data

May 27, 2008 (JP) ................................. 2008-138383

(51) Int. Cl.
*G06F 19/00* (2011.01)

(52) U.S. Cl. ........ 700/109; 700/121; 700/230; 118/668; 118/712

(58) Field of Classification Search ............. 700/95, 700/100–103, 113, 117, 121, 159, 160, 169, 700/173, 174; 118/668

See application file for complete search history.

(56) References Cited

U.S. PATENT DOCUMENTS

| | | | | |
|---|---|---|---|---|
| 5,121,331 A * | 6/1992 | Lovrenich | | 700/116 |
| 6,381,509 B1 * | 4/2002 | Thiel et al. | | 700/115 |
| 6,502,294 B2 * | 1/2003 | Kusmierczyk et al. | | 29/430 |
| 7,233,405 B2 * | 6/2007 | Fromherz | | 358/1.13 |
| 7,260,441 B2 * | 8/2007 | Hranica et al. | | 700/109 |
| 2004/0089421 A1 * | 5/2004 | Komandur et al. | | 156/345.32 |
| 2005/0061242 A1 * | 3/2005 | Shiga et al. | | 118/708 |
| 2007/0088450 A1 | 4/2007 | Shinozuka et al. | | |
| 2010/0223781 A1 * | 9/2010 | Sumi | | 29/739 |

FOREIGN PATENT DOCUMENTS

JP    2005-175052 A1    6/2005
JP    2008-071824 A1    3/2008

* cited by examiner

*Primary Examiner* — Mohammad Ali
*Assistant Examiner* — Sheela S Rao
(74) *Attorney, Agent, or Firm* — Burr & Brown

(57) ABSTRACT

When a product substrate passes a reference module which is an n-th module ahead of an inspection module in a transfer path, an inspection reservation signal for performing an inspection to a lot to which the product substrate belongs is outputted to the inspection module. When the inspection module is in trouble, the output of an inspection reservation signal for a product substrate is forbidden, and the product substrates to be transferred to the inspection module are transferred to a module which is next to the inspection module in a transfer order. When the trouble of the inspection module has been resolved and a substrate for confirmation inspection is preferentially transferred to the inspection module, an inspection reservation signal for the substrate for confirmation inspection is outputted, the substrate for confirmation inspection is transferred to the inspection module, and the confirmation inspection for the inspection module is performed.

14 Claims, 11 Drawing Sheets

COATING AND DEVELOPING APPARATUS, COATING AND DEVELOPING METHOD, AND STORAGE MEDIUM

FIELD OF THE INVENTION

The present invention relates to a coating and developing apparatus, a coating and developing method, and a storage medium, that are used for subjecting a substrate, such as a semiconductor wafer and an LCD substrate (a glass substrate for liquid crystal display), to a resist-liquid coating process and a developing process after exposure.

BACKGROUND OF THE INVENTION

A series of processes, which coat a substrate, such as a semiconductor device and an LCD substrate, with a resist liquid, and develop the substrate after the resist has been developed with a predetermined pattern, so as to form a desired resist pattern on the substrate, are generally performed by a system in which an exposure apparatus is connected to a coating and developing apparatus that performs a resist-liquid coating process and a developing process. The system is composed by linearly arranging: a carrier block on which a wafer cassette accommodating a substrate such as a semiconductor wafer (herein after referred to as "wafer"), the carrier block having a transfer arm that transfers a wafer to and from the wafer cassette; a process block that performs a resist-liquid coating process and a developing process on a wafer transferred from the carrier block; and an interface block that connects the process block and an exposure apparatus with each other.

Wafers on which a resist pattern has been formed are subjected to a predetermined inspection which inspects a line width of the resist pattern, an overlapping condition of the resist pattern and a base pattern, and a developing defect. Then, only the wafers accepted by the inspection are subjected to a succeeding process. At this time, since an inline system in which an inspection module is disposed in a coating and developing apparatus is easy to use, the present inventors adopt a structure, as shown in FIG. 10, in which an inspection block B2 including a plurality of inspection modules 11 is interposed between a carrier block B1 and a process block B3. In FIG. 10, the reference numbers B4 and B5 depict an interface block and an exposure apparatus, respectively.

In such a system, wafers in a wafer cassette 10 are transferred from the carrier block B1 to the process block B3 through the inspection block B2 without stopping thereat. After the wafers has been subjected to a resist-liquid coating process in the process block B3, the wafers are transferred through the interface block B4 to the exposure apparatus B5, and subjected to a predetermined exposure process by the exposure apparatus. The exposed wafers are then subjected to a developing process in the process block B3, and thereafter the wafers are subjected to a predetermined inspection in the inspection block B2. On the other hand, wafers, which are not subjected to an inspection, are developed in the process block B3, and then returned to the carrier block B1 through the inspection block B2 without stopping thereat.

At this time, whether to inspect wafers in a lot or not, and a type of inspection, if an inspection is performed, are previously determined for each lot. In a case in which an inspection is performed, for example, when wafers are taken out from the wafer cassette 10 by a transfer arm (not shown) of the carrier block B1, an inspection reservation signal is outputted from a control part (not shown), which controls the coating and developing apparatus, to an inspection module which will perform the inspection. The inspection module performs an inspection on wafers, whose inspection reservation signals have been received, in the order of the receipt of the inspection reservation signals.

The reason for previously outputting an inspection reservation signal to the inspection module 11 before the wafers are transferred to the inspection module 11 is to facilitate creation of a transfer program. In addition, it takes a predetermined time period for the inspection module to get prepared. Thus, the preparation of the inspection module is made in parallel with a resist-pattern formation process, whereby processed wafers can be inspected immediately after the wafers have been transferred to the inspection block B2. In this manner, a decrease in throughput can be prevented.

If the inspection module 11 has trouble, wafers to be inspected by the inspection module 11 are transferred in a bypassing manner until the trouble of the inspection module 11 is resolved and the inspection module 11 returns to a normal state. To transfer wafers in a bypassing manner herein means to transfer the wafers to a buffer module 12, instead of the inspection module 11, disposed in the inspection block B2 and to transfer the wafers to a destination next to the inspection module, such as the carrier block B1.

When the trouble of the inspection module 11 is resolved, a wafer to be inspected for confirmation is transferred from the carrier block B1 directly to the inspection block B2. Then, the inspection module 11 inspects the wafer for inspection confirmation so as to confirm whether the inspection module 11 is in order or not. After the wafer for inspection confirmation has been inspected by the inspection module 11, the wafer is again returned to the carrier block B1.

However, in the above structure, there is a possibility that, although the trouble of the inspection module 11 has been resolved and the inspection module 11 becomes available, many wafers have not been transferred to the inspection module 11, so that the wafers cannot be subjected to the inspection. This problem is concretely described with reference to FIG. 11. In FIG. 11, the horizontal axis shows a time. The first row of FIG. 11 shows a timing at which wafers are taken out from the wafer cassette 10 in the carrier block B1, and a timing at which the wafers are returned to the wafer cassette 10. The second row of FIG. 11 shows a process condition of the wafers in the inspection module 11, and the third row thereof shows a transfer condition of the wafers to the buffer module 12.

The first row is described at first. Lots A to F respectively accommodate twenty-five wafers. The wafers in the respective lots A to F are inspected by one inspection module 11, and then returned to the carrier block B1 which is a destination next thereto. Time point at a left end of each of the lots A to F is a timing at which a first wafer is taken out from the wafer cassette 10 of each of the lots A to F in the carrier block B1, and a time point at a right end of each of the lots A to F is a timing at which a last wafer of the wafers in each of the lots A to F, which have been subjected to all the processes including the inspection, is returned to the wafer cassette 10. Namely, a time point T1 shows a time point at which a first wafer (A1) of the lot A is taken out from the wafer cassette 10, and a time point T4 shows a time point at which a last wafer (A25) of the lot A is returned to the wafer caste 10. When a first wafer of each of the lots A to F is taken out from the wafer cassette 10, an inspection reservation signal is outputted from the control part to the inspection module 11 intended for performing an inspection to the wafers. Namely, in the lot A, an inspection reservation signal a is outputted at the time point T1 at which the first wafer (A1) is taken out from the wafer cassette 10A.

The second row is described. A time point at a left end of each of the lots A to F corresponds to a time point at which a first wafer in each of the lots A to F is loaded into the inspection module 11, and a time point at a right end of each of the lots A to F corresponds to a time point at which a last wafer in each of the lots A to F is unloaded from the inspection module 11. For example, a time point T2 is timing at which the first wafer (A1) in the lot A is loaded into the inspection module 11, and a time point T4 are a timing at which the last wafer (A25) in the lot A is unloaded from the inspection module 11, and a timing at which a first wafer (B1) in the lot B is loaded into the inspection module 11.

Wafers are transferred to the inspection module 11 by means of a transfer means disposed on the inspection block B2. The transfer means is provided with two arms. An inspected wafer (A25) is taken out by the one arm from the inspection module 11, and a wafer (B1) to be inspected, which is held by the other arm, is continuously transferred to the inspection module 11. Thus, although there is a slight time lag between the timing at which the wafer (A25) is taken out and the timing at which the wafer (B1) is transferred, such a time lag is significantly short. Thus, these timings are shown by the same time point as a matter of convenience. Although a time point T4 corresponds to a time point at which the wafer (A25) is returned to the wafer cassette 10 in the first row, the wafer (A25) taken out from the inspection module 11 is immediately transferred into the carrier block B1. Thus, FIG. 11 shows these time points by the same time point for a matter of convenience. This holds true with the other cases.

A time point T3 is a time point at which the inspection module 11 to be used has a trouble, and a time point T5 shows a time point at which the trouble of the inspection module 11 is resolved and the inspection module 11 becomes available. In this example, in the course of the inspection of the wafers of the lot A, trouble occurs in the inspection module 11.

As described above, when a first wafer of each of the lots A to F is taken out from the wafer cassette 10, an inspection reservation signal is outputted to the inspection module 11. However, when the inspection module 11 has trouble and is unavailable, the control part forbids the output of an inspection reservation signal. Thus, in this embodiment, during an interval between the time point T3 and the time point T5, the inspection module 11 is unavailable because of the trouble. Since a first wafer of the lot D and a first wafer of the lot E are taken out from the wafer cassettes 10 during the trouble, the control part does not output an inspection reservation signal for the lot D and E.

Thereafter, when the trouble of the inspection module 11 is resolved and the inspection module 11 becomes available, a wafer CW for inspection confirmation is brought out from the wafer cassette 10. When this wafer CW for inspection confirmation is brought out from the wafer cassette 10, an inspection reservation signal w for the wafer CW is outputted to the inspection module 11. Thus, the inspection reservation signal w for the wafer CW for inspection confirmation is received by the inspection module 11, with the order of the inspection reservation signal w being next to an inspection reservation signal c for the lot C.

During the time inspection module 11 is unavailable (the time interval between the time point T3 and the time point T5), wafers to be transferred to the inspection module 11 during this time, with inspection reservation signals for the wafers having been outputted to the inspection module 11 before the inspection module 11 has a trouble (i.e., latter wafers of lot A, wafers of lot B, and wafers of lot C), and are ready to be transferred into the inspection module 11. Thus, these wafers are transferred in a bypassing manner to the buffer module 12, instead of the inspection module 11, of the inspection block B2. In this example, the trouble of the inspection module 11 is resolved during the course of taking out the wafers of the lot C. However, the inspection reservation signal c for all the wafers of the lot C has been already outputted, all the wafers of the lot C are transferred to the buffer module 12 in the bypassing manner.

On the other hand, wafers whose inspection reservation signals are not outputted, which are all the wafers of lots D and E, are handled similarly to wafers that are not inspected, and transferred in a skipping manner. To transfer wafers in a skipping manner means that wafers are transferred similarly to a wafer that has not been inspected, and to a destination next to the inspection module 11 (i.e., to the carrier block B1 for example).

The inspection reservation signal w for the confirmation wafer CW is received after the inspection reservation signal for the wafers W of the lot C have been received. Thus, after the wafers W of the lot C have been transferred in the bypassing manner, the confirmation wafer CW is transferred to the inspection module 11, and subjected to a confirmation inspection in the inspection module 11.

After the confirmation inspection using the confirmation wafer CW has been finished, the inspection module 11 resumes an inspection for wafers of a lot. In this example, it has been already determined that the wafers W of lots D and E are transferred in the skipping manner. Thus, from the wafers of lot F, the wafers are transferred to the inspection module 11 and subjected to an inspection in the inspection module 11.

Although the trouble of the inspection module 11 is resolved at the time point T5 so that the inspection module 11 becomes available in the course of taking out the wafers of lot C, lots D and E are transferred in the skipping manner. Namely, the wafer lots (i.e., the wafers in lots D and E) cannot be inspected.

An overlapping inspection module for performing an overlapping inspection is subjected to a periodic inspection (maintenance) once per day. During this periodic inspection, wafers W cannot be transferred to the overlapping inspection module. The periodic inspection is completed after the confirmation inspection of the overlapping module of a confirmation wafer CW is performed. Thus, there generates a similar problem. This problem is concretely described with reference to FIG. 12. Similarly to F*ig*. 11, a horizontal axis in FIG. 12 shows a time. The first row in FIG. 12 shows a timing at which a wafer is taken out from the wafer cassette 10 in the carrier block B1, and a timing at which a wafer is returned to the wafer cassette 10. The second row in FIG. 12 shows a process condition of the wafers in the overlapping inspection module, and the third row in FIG. 12 shows a transfer condition of wafers to the buffer module 12.

Also in this case, a first wafer in each of the lots A to F is taken out from the wafer cassette 10, an inspection reservation signal is outputted to the overlapping inspection module, In this example, an interval between a time point T13 and a time point T15 is the periodic inspection time. The periodic inspection includes a time required for a confirmation inspection for the overlapping inspection module of a confirmation wafer CW.

During the periodic inspection time for the overlapping module, the control part forbids an output of an inspection reservation signal for the wafers in a lot. Thus, in this example, no inspection reservation signal is outputted for the wafers of lots D and E that are brought out from the carrier block B1 during the periodic inspection time. Wafers W of the lots A to C whose inspection reservation signals haven been outputted (i.e., wafers to be transferred to the inspection module during the periodic inspection) are transferred in the bypassing manner. The wafers W of the lots D and E whose inspection reservation signals are not outputted are transferred in the skipping manner.

Since an inspection reservation signal w for the confirmation wafer CW is received after an inspection reservation signal c of lot C has been received by the overlapping inspection module, the confirmation wafer CW is transferred to the overlapping inspection module after the wafers of lot C have been transferred in the bypassing manner. Namely, in the course of transferring the lot D in the skipping manner, the confirmation wafer CW is transferred to the inspection module and subjected to a confirmation inspection. At the time when the confirmation wafer CW is unloaded from the inspection module upon completion of the confirmation inspection, the periodic inspection is completed. After the completion of the periodic inspection, the overlapping inspection module resumes an inspection for wafers of a lot. Thus, in this example, from the wafers of lot F. the wafers are inspected by the overlapping inspection module.

Therefore, in this example, although the overlapping inspection module becomes ready to receive the confirmation wafer CW, the confirmation wafer CW is transferred thereto after lot C has been transferred in the bypassing manner. Thus, there may occur a problem in that the start of the confirmation inspection is delayed, resulting in the elongation of the periodic inspection time. In addition, there may occur another problem in that, although the periodic inspection of the overlapping inspection module is finished at the time point T15, the wafers W of lots D and E are transferred in the skipping manner, whereby the wafer lots cannot be inspected.

Patent Document 1 describes a structure in which an inspection block including a plurality of inspection apparatuses is interposed between a cassette station and a process station. The system described therein performs a transfer control that is called a restart control in which a wafer is transferred from the cassette station to the process station through an inspection station, a processed wafer is returned to a carrier in a carrier station and temporarily received therein, and the wafer is transferred to the inspection station so as to inspect the wafer. However, since Patent Document 1 does not consider a case when the inspection apparatus has a trouble and/or how to control the transfer of the wafer during a maintenance operation of the inspection apparatus, the problem of the present invention cannot be solved even by the structure of the Patent Document 1.

Patent Document 1: JP2005-175052A

SUMMARY OF THE INVENTION

The present invention has been made in view of the above circumstances. The object of the present invention is to provide a technique in which, after a trouble of an inspection module has been resolved, by selecting whether to preferentially transfer a product substrate or a substrate for inspection confirmation to the inspection module, a degree of freedom of the process can be enhanced, particularly when a confirmation inspection is performed, a product substrate can be transferred to the inspection module so as to be inspected, immediately after the confirmation inspection. Another object of the present invention is to provide a technique for reducing a time period required for a periodic inspection for the inspection module, and to transfer a process substrate to the inspection module inspection so as to be inspected, immediately after the periodic inspection.

Therefore, in the present invention a coating and developing apparatus is provided for processing a plurality of product substrates grouped in lots, the coating and developing apparatus comprising: a carrier block on which a product carrier accommodating a plurality of product substrates is placed, the carrier block having a transfer means configured to transfer the substrates to and from a block adjacent to the carrier; a process block including: a plurality of modules including a module configured to perform a coating process for coating the product substrates, which have been transferred from the carrier block, with a resist, and a module configured to perform a developing process for developing the product substrates which have been coated with the resist and exposed; and a first substrate conveying means configured to transfer the product substrates to and from these modules; an inspection block including an inspection module configured to perform an inspection to the developed product substrates in an order of inspection reservations received by the inspection module, and a second substrate conveying means configured to transfer the substrates to and from the inspection module; a storage part configured to accommodate a substrate for confirmation inspection used for confirming whether the inspection module is in order or not; a selecting means by which an operator selects whether a product substrate or a substrate for confirmation inspection is preferentially transferred to the inspection module which had trouble, after the trouble has been resolved; and a control means configured to control the transfer means and the second substrate conveying means; wherein the control part performs: a step in which, when the product substrate passes a reference module which is an n-th (n is an integer not less than 1) module ahead of the inspection module in a transfer path, an inspection reservation signal for performing an inspection to a lot to which the product substrate belongs is outputted to the inspection module; a step in which, during when the inspection module is in trouble, the output of an inspection reservation signal for a product substrate is forbidden, and the product substrates to be transferred to the inspection module are transferred to a module which is next to the inspection module in a transfer order; a step in which, when the trouble of the inspection module has been resolved and a product substrate is selected as a substrate to be preferentially transferred by the selecting means, the forbiddance of the output of an inspection reservation signal for a product substrate is released; and a step in which, when the trouble of the inspection module has been resolved and a substrate for confirmation inspection is selected as a substrate to be preferentially transferred by the selecting means, the substrate for confirmation inspection is unloaded from the storage part, an inspection reservation signal for the substrate for confirmation inspection is outputted, and after a confirmation inspection of the inspection module performed by using the substrate for confirmation inspection has been completed, the forbiddance of the output of an inspection reservation signal for a product substrate is released.

Another invention of the present invention is a coating and developing apparatus for processing a plurality of product substrates grouped in lots, the coating and developing apparatus comprising: a carrier block on which a product carrier accommodating a plurality of product substrates is placed, the carrier block having a transfer means configured to transfer the substrates to and from a block adjacent to the carrier; a process block including: a plurality of modules including a module configured to perform a coating process for coating the product substrates, which have been transferred from the carrier block, with a resist, and a module configured to perform a developing process for developing the product substrates which have been coated with the resist and exposed; and a first substrate conveying means configured to transfer the product substrates to and from these modules; an inspection block including an inspection module configured to perform an inspection to the developed product substrates in an order of inspection reservations received by the inspection module, and a second substrate conveying means configured to transfer the substrates to and from the inspection module; a storage part configured to accommodate a substrate for confirmation inspection used for confirming whether the inspection module is in order or not; and a control means configured to control the transfer means and the second substrate conveying means; wherein the control part performs: a step in which, when the product substrate passes a reference module which is an n-th (n is an integer not less than 1) module ahead of the inspection module in a transfer path, an inspection reservation signal for performing an inspection to a lot to which the product substrate belongs is outputted to the inspection module; a step in which, during when a periodic inspection of the inspection module is performed, the output of an inspection reservation signal for a product substrate is forbidden, and the product substrates to be transferred to the inspection module are transferred to a module which is next to the inspection module in a transfer order; a step in which, before the periodic inspection of the inspection module is completed, a substrate for confirmation inspection is unloaded from the storage part and an inspection reservation signal for the substrate for confirmation inspection is outputted; and a step in which, after a confirmation inspection of the inspection module performed by using the substrate for confirmation inspection has been completed, the forbiddance of the output of an inspection reservation signal for a product substrate is released.

The inspection block may be interposed between the carrier block and the process block. In addition, the storage part may be a carrier accommodating a substrate for confirmation inspection, and the carrier may be placed on the carrier block. Further, the product substrate for which the inspection reservation signal may be outputted when the product substrate passes the reference module is a first product substrate in a lot to which the product substrate belongs. Furthermore, the timing when the product substrate passes the reference module may be a timing when the product substrate is transferred from the first substrate conveying means or the second substrate conveying means to the reference module, or a timing when the product substrate is transferred from the reference module to the first substrate conveying means or the second substrate conveying means.

The coating and developing method of the present invention is a coating and developing method for processing a plurality of product substrates grouped in lots, the coating and developing method performing: in a process block, a coating process for coating product substrates, which have been transferred from a carrier block, with a resist, and a developing process for developing the product substrates which have been coated with the resist and exposed; inspecting the developed product substrates in an inspection module, and returning the product substrates to the carrier block; and performing a confirmation inspection for confirming whether the inspection module is in order or not by using a substrate for confirmation inspection; the coating and developing method comprising: a step in which, when a product substrate passes a reference module which is an n-th (n is an integer not less than 1) module ahead of the inspection module in a transfer path, an inspection reservation signal for performing an inspection to a lot to which the product substrate belongs is outputted to the inspection module; a step in which the inspection is performed in the inspection module to the product substrates in an order of the receipt of the inspection reservation signals; a step in which an operator selects whether a product substrate or a substrate for confirmation inspection is preferentially transferred to the inspection module which had a trouble, after the trouble has been resolved; a step in which, during when the inspection module is in trouble, the output of an inspection reservation signal for a product substrate is forbidden, and the product substrates to be transferred to the inspection module are transferred to a module which is next to the inspection module in a transfer order; a step in which, when the trouble of the inspection module has been resolved and a product substrate is selected as a substrate to be preferentially transferred, the forbiddance of the output of an inspection reservation signal for a product substrate is released; a step in which, when the trouble of the inspection module has been resolved and a substrate for confirmation inspection is selected as a substrate to be preferentially transferred, an inspection reservation signal for the substrate for confirmation inspection is outputted, the substrate for confirmation inspection is transferred to the inspection module, and after a confirmation inspection of the inspection module has been completed, the forbiddance of the output of an inspection reservation signal for a product substrate is released.

Another coating and developing method of the present invention is a coating and developing method for processing a plurality of product substrates grouped in lots, the coating and developing method performing: in a process block, a coating process for coating product substrates, which have been transferred from a carrier block, with a resist, and a developing process for developing the product substrates which have been coated with the resist and exposed; inspecting the developed product substrates in an inspection module, and returning the product substrates to the carrier block; and performing a confirmation inspection for confirming whether the inspection module is in order or not by using a substrate for confirmation inspection; the coating and developing method comprising: a step in which, when the product substrate passes a reference module which is an n-th (n is an integer not less than 1) module ahead of the inspection module in a transfer path, an inspection reservation signal for performing an inspection to a lot to which the product substrate belongs is outputted to the inspection module; a step in which the inspection is performed in the inspection module to the product substrates in an order of the inspection reservation signals received by the inspection module; a step in which, during when a periodic inspection of the inspection module is performed, the output of an inspection reservation signal for a product substrate is forbidden, and the product substrates to be transferred to the inspection module are transferred to a module which is next to the inspection module in a transfer order; a step in which, before the periodic inspection of the inspection module is completed, an inspection reservation signal for a substrate for confirmation inspection is outputted and a substrate for confirmation inspection is unloaded from the storage part; and a step in which, after a confirmation inspection of the inspection module performed by using the substrate for confirmation inspection has been completed, the forbiddance of the output of an inspection reservation signal for a product substrate is released.

The storage medium of the present invention is a storage medium used for a coating and developing apparatus that coats a product substrate with a resist liquid and develops a product substrate which has been coated with a resist liquid and developed, the storage medium storing a computer program executable by a computer to form the aforementioned coating and developing method.

If the inspection module has a trouble, it is possible to select whether the product substrate or the substrate for confirmation inspection is preferentially transferred to the inspection module after the trouble has been resolved, whereby a degree of freedom in the process can be enhanced. In addition, when the substrate for confirmation inspection is preferentially transferred to the inspection module, since an inspection reservation signal for a product substrate is forbidden to be outputted, an inspection reservation signal for the substrate for confirmation inspection is preferentially received by the inspection module. Thus, the inspection module can promptly perform a confirmation inspection, and immediately after the confirmation inspection, the inspection module can resume an inspection for a product substrate.

In another example, when a periodic inspection is performed to the inspection module, an inspection reservation signal for a product substrate is forbidden to be outputted during the periodic inspection. Thus, an inspection reservation signal for a substrate for confirmation inspection is preferentially received by the inspection module. Thus, the inspection module can promptly perform a confirmation inspection to the confirmation inspection substrate, so that a time required for the periodic inspection can be reduced, and immediately after the confirmation inspection, the inspection module can resume an inspection for a product substrate.

DETAILED DESCRIPTION OF THE INVENTION

Figure 1:
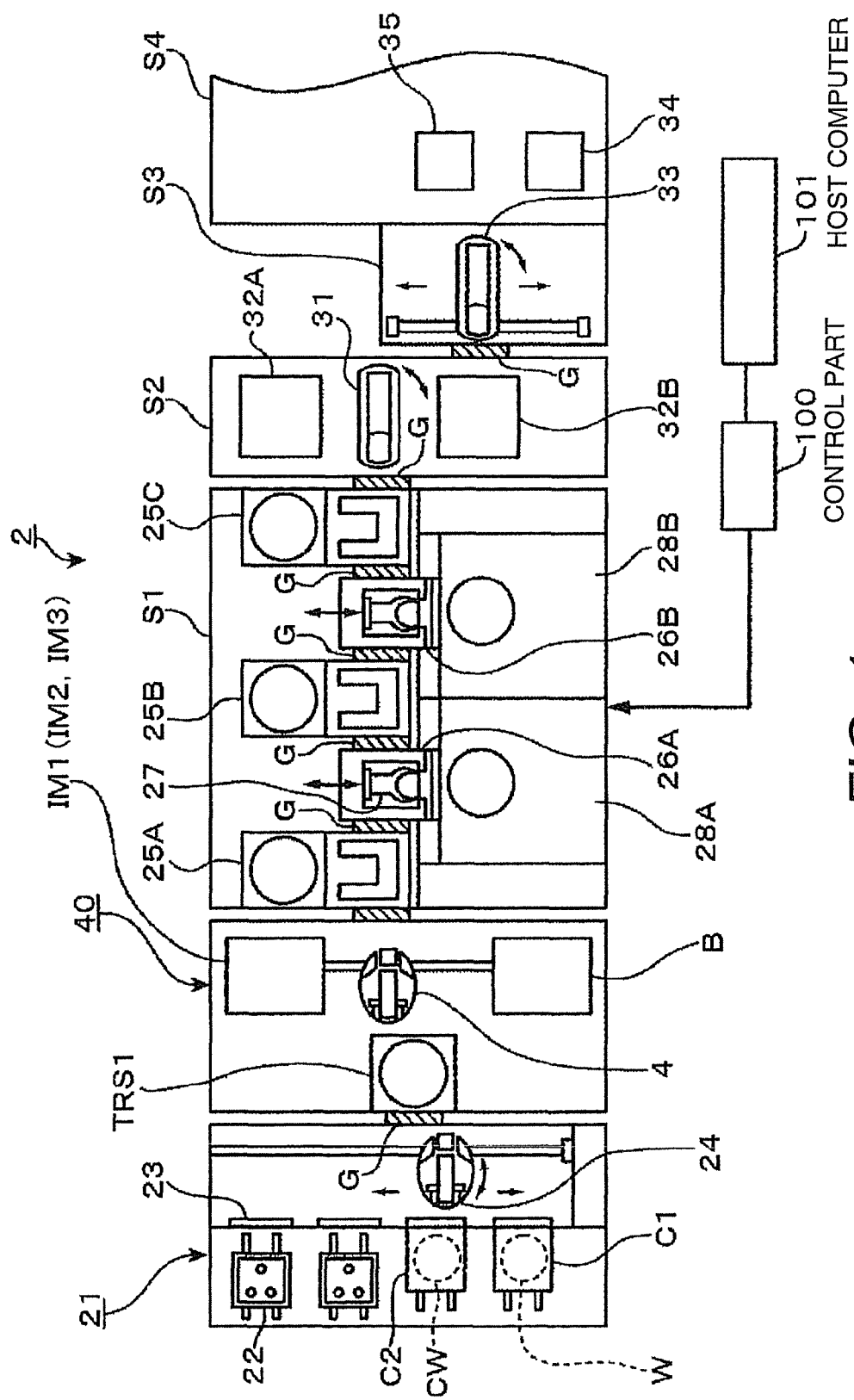
FIG. 1 is a plan view showing an embodiment of a coating and developing apparatus according to the present invention.
Figure 2:
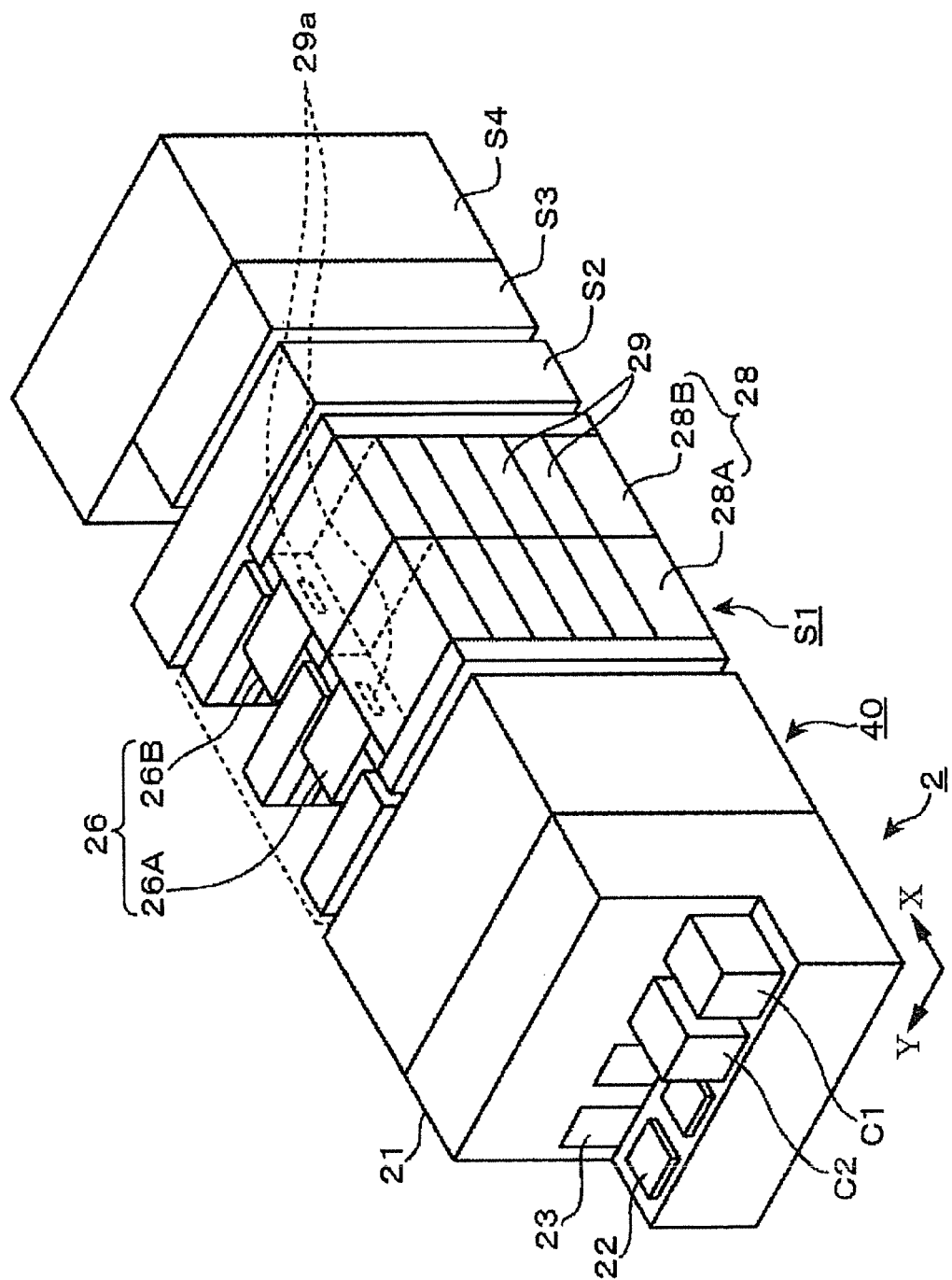
FIG. 2 is a perspective view showing an appearance of the coating and developing apparatus.

An embodiment of a coating and developing apparatus 2 of the present invention is firstly described with reference to the plan view of FIG. 1 and the perspective view of FIG. 2. A product-wafer carrier C1 capable of accommodating a wafer W which is a product substrate to be coated and developed, and a confirmation-wafer carrier C2 capable of accommodating a confirmation wafer CW which is a substrate for a confirmation inspection, are loaded from outside into the coating and developing apparatus 2 and unloaded therefrom to the outside, by a transfer mechanism, riot shown. The confirmation-wafer carrier C2 corresponds to a storage part. The reference number 21 depicts a carrier block (i.e., section) on which the carriers C1 and C2 are placed. The carrier C1 for product wafer W hermetically accommodates a plurality of (e.g., twenty five) wafers W. Individual lots to which wafers W belong differ for each carrier C1. The lots herein mean groups of substrates, which are classified by a process type.

The carrier block 21 includes tables 22 on which the carriers C1 and C2 can be placed, opening and closing parts 23 formed in a wall surface in front of the tables 22, and a transfer arm 24 serving as a transfer means for transferring a wafer W from the carriers C1 and C2 through the opening and closing parts 23. Arms of the transfer arm 24 are capable of being moved in a vertical direction, a right and left direction, and a fore and aft direction, and of being rotated about a vertical axis. The transfer arm 24 is controlled based on a command from a control part 100 which will be described below.

Figure 3:
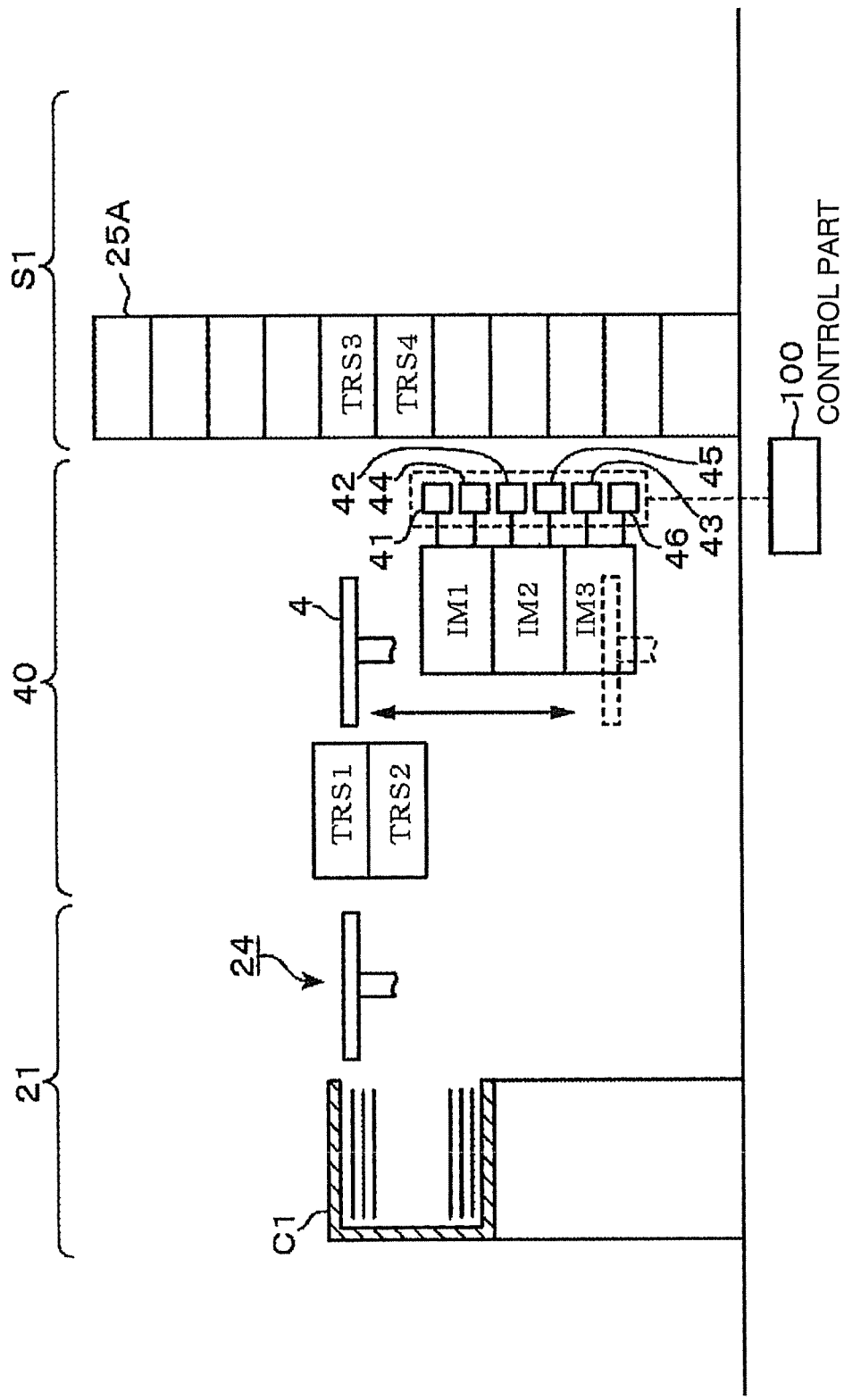
FIG. 3 is a longitudinal sectional view showing the coating and developing apparatus.

An inspection block 40 and a process block S1, which are respectively surrounded by housings, are connected in this order to a rear part of the carrier block 21. As shown in FIG. 3, for example, the inspection block 40 includes: a plurality of (e.g., two) transfer stages TRS 1 and TRS2; a plurality of (e.g., three) inspection modules IM1 to IM3; a conveying arm 4 serving as a second substrate conveying means configured to transfer a wafer among the transfer stages TRS1 and TRS2, the inspection modules IM1 to IM3, and transfer stages TRS3 and TRS4 of the process block S1, which will be described below; and a buffer module B configured to temporarily receive a wafer W loaded from the process block S1 to the inspection block 40. The transfer stages TRS 1 and TRS2 are vertically stacked on each other, for example, and the inspection modules IM1 to IM3 are also vertically stacked on each other. The conveying arm 4 has two arms which are capable of being moved in the vertical direction, the right and left direction, and the fore and aft direction, and of being rotated about the vertical axis. The transfer arm 24 is controlled based on a command from the below-described control part 100.

The transfer stage TRS1 is a stage on which a wafer W, which is taken out from the carriers C1 and C2 and is going to be brought to the process block S1, can be placed. The transfer stage TRS2 is a stage on which a wafer W, which is transferred from the inspection block 40 to the carrier block 21, can be placed.

In this example, the inspection module IM1 is a module that detects a macro defect on a wafer. The inspection module IM2 is a film-thickness and line-width inspection module that measures a thickness of a film and a line width of a pattern which are formed on a wafer. The inspection module IM3 is an overlapping inspection module that detects an overlapping displacement between a pre-exposed wafer and a post-exposed wafer, i.e., a displacement between a pattern which is newly formed and a base pattern. The respective inspection modules are provided with reservation-signal receiving parts 41, 42, and 43 each receives an inspection reservation signal outputted from the below-described control part 100. Each of the inspection modules IM1 to IM3 is configured to perform a predetermined inspection to wafers (a product wafer (product substrate) W and a confirmation wafer (substrate for confirmation inspection) CW) in an order of the receipt of inspection reservation signals.

The inspection modules IM1 to IM3 are further provided with signal sending and receiving parts 44. 45, and 46, respectively, which output a predetermined alarm when the corresponding inspection module has a trouble, a trouble resolution signal to the control part 100 when the trouble of the inspection module is resolved, a confirmation-inspection receivable signal, and a periodic-inspection completion signal, and receives a periodic inspection command from the control part 100, The alarm is outputted as an alarm sound, a lamp illumination, or a display on a display screen of the below-described control part 100.

In the process block S1, there are alternately disposed three shelf modules 25A, 25B, and 25C which are formed by stacking heating and cooling process modules on each other, and two main arms 26A and 26B that are first substrate conveying means for transferring a wafer W to and from liquid-process modules described below, in this order from the front. Each of the main arms 26A and 26B has two arms which are capable of being moved in the vertical direction, the right and left direction, and the fore and aft direction, and of being rotated about the vertical axis. The transfer arms 26A and 26B are controlled based on a command from the below-described control part 100.

The shelf modules 25A, 25B and 25C, and the main arms 26A and 26B are aligned in the fore and aft direction when seen from the carrier block 21. Connecting regions G therebetween are equipped with openings, not shown, through which a wafer can be transferred. Thus, a wafer W can be freely moved in the process block S1 from the shelf module 25A on one end to the shelf module 25C on the other end. The main arms 26A and 26B are arranged in a space surrounded by a partition wall composed of surfaces of the shelf modules 25A, 25B, and 25C which are arranged in the fore and aft direction when seen from the carrier block 21, surfaces of the liquid-process modules on the right side, for example, and rear surfaces on the left side.

The liquid-process modules 28A and 28B are disposed on positions at which a wafer W is transferred by the main arms 26A and 26B. The process-liquid modules 28A and 28B are formed by stacking liquid-process apparatuses such as a coating apparatus (COT) that coats a wafer with a resist and a developing apparatus (DEV) that performs a developing process. As shown in FIG. 2, for example, each of the liquid-process modules 28A and 28B is formed by stacking a plurality of (e.g., five) process vessels 29 in which the respective liquid-process apparatuses are received.

In the shelf modules 25A, 25B, and 25C, a transfer stage (TRS) for transferring a wafer W, a heating module (LHP) for heating a wafer W after a developing process, and a cooling module (CPL) for cooling a wafer W before and after a resist-liquid coating process and after a developing process, a baking module (PAB) for baking a wafer W after a resist-liquid coating process and before an exposure process, and a baking module (PEB) for baking a wafer W after an exposure process, are vertically assigned to ten levels, for example. The transfer stages TRS3 and TRS4 are used for transferring a wafer W between the carrier block 21 and the process block S1.

An exposure apparatus S4 is connected to a rear side of the shelf module 25C in the process block S1 through a first interface block S2 and a second interface block S3. The first interface block S2 includes: a transfer arm 31 for transferring a wafer W to and from the cooling module CPL and the baking module PEB of the shelf module 25C of the process block S1; a shelf module 32A formed by stacking a peripheral exposure apparatus, a buffer cassette, and so on; and a shelf module 32B formed by stacking a transfer stage of a wafer W, a high-precision temperature adjusting module, and so on.

The second interface block S3 is provided with a transfer arm 33 by which a wafer W can be transferred to and from the shelf module 32B of the first interface block S2, and an in-stage 34 and an out-stage 35 of the exposure apparatus S4.

Each of the main arms 26A and 26B are configured to take out a wafer W that is placed in a certain module, and to transfer another wafer W held by the main arms 26A and 26B to this module. Based on a transfer schedule that has been created beforehand (an order of modules to which a wafer W is transferred), the main arms 26A and 26B transfer, one by one, wafers W placed on a certain module to a next module. The module herein means a location on which a wafer W is placed, and includes not only the various process modules, but also the carriers, the transfer stages, and the buffer cassettes.

Figure 4:
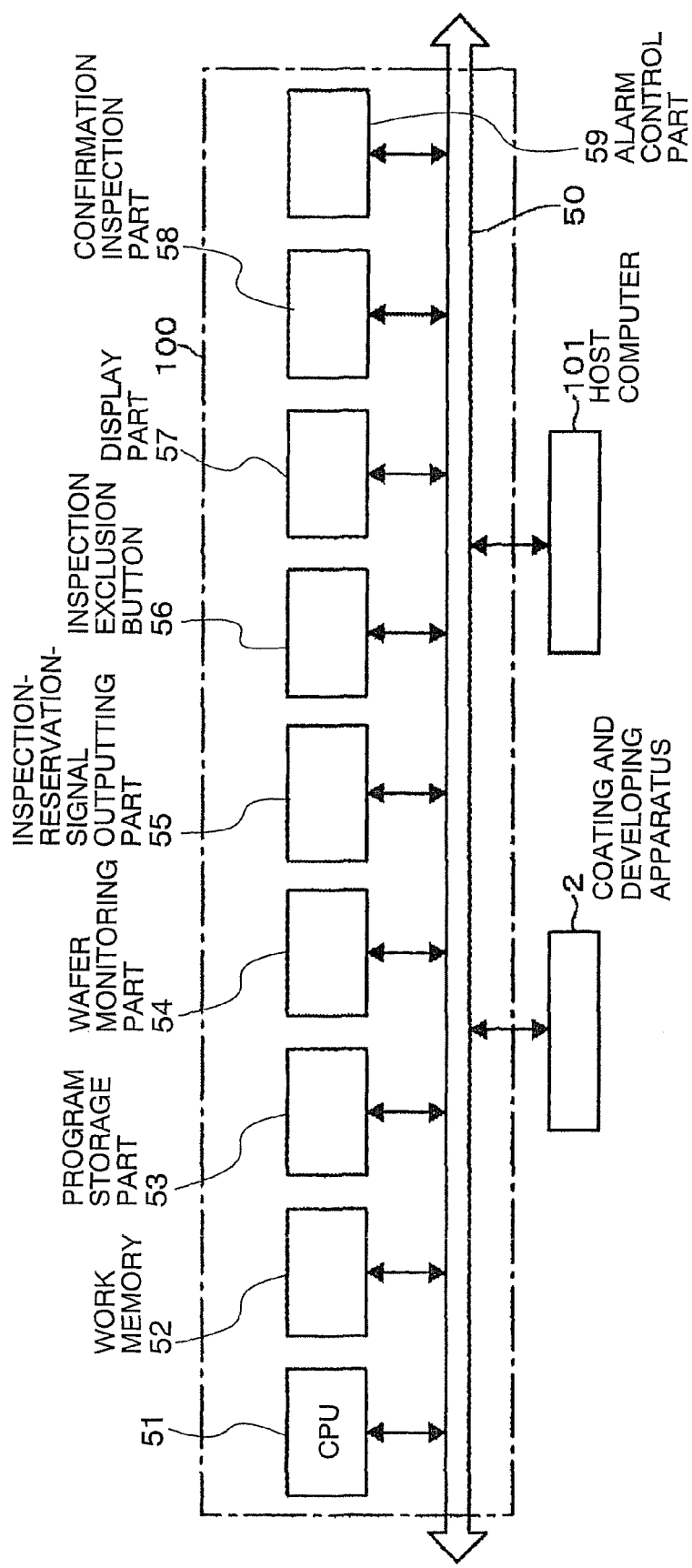
FIG. 4 is a structural view of a control part of the coating and developing apparatus.

The coating and developing apparatus 2 is equipped with the control part 100 (including, e.g., a computer). FIG. 4 shows a structure of the control part 100. In FIG. 4, the reference number 50 depicts a bus to which a CPU 51 for performing various calculations, a work memory 52, and a program storage part 53 are connected. Stored in the program storage part 53 is a program (formed of, e.g., software incorporating commands) for implementing operations of the coating and developing apparatus 2 (i.e, the processes of wafers and the control of transfer of wafers). The control part 100 reads the program, and outputs instructions to the transfer arm 24, the conveying arm 4, and the main arms 26A and 26B, etc so as to control the below-described operations of the coating and developing apparatus 2. The program, which is stored in a recording medium such as a hard disk, a compact disk, a magnetoptical disk, and a memory card, is stored in the program storage part 53.

A host computer 101 is connected to the control part 100. The host computer 101 sets an identification code including process recipe information such as whether a lot is to be inspected after a coating and developing process is received in each carrier C1 to be transferred to the coating and developing apparatus 2, which inspection module is used when an inspection is performed, and in which order the plurality of inspection modules are used when an inspection is performed by the plurality of inspection modules, and manages timings at which each carrier C1 is loaded into the coating and developing apparatus 2. Before a carrier C1 is transferred to the coating and developing apparatus 2, the host computer 101 sends a signal corresponding to the identification code to the control part 100. The control part 100 reads the program based on the signal, and a series of processes including transfer operations of the transfer arm 24 and the conveying arm 4 are controlled by the read-out program.

In addition, the control part 100 includes a wafer monitoring part 54 for monitoring where each of wafers W in the respective lots is positioned in the coating and developing apparatus 2, an inspection-reservation-signal outputting part 55, an inspection exclusion button 56 operated by an operator, a display part 57, a confirmation inspection part 58, and an arm control part 59.

The inspection-reservation-signal outputting part 55 is a means for outputting, when a wafer W passes, in a transfer path, through a reference module which is an n-th (n is an integer not less than 1) module ahead of an inspection module to be used, an inspection reservation signal to the inspection module, so as to perform an inspection for the lot to which the wafer W belongs, and a means for forbidding the output of an inspection reservation signal and for releasing the forbiddance of the output of an inspection reservation signal. The inspection-reservation-signal outputting part 55 also outputs, when a confirmation wafer CW passes, in a transfer path, through an inspection reference module which is an n-th (n is an integer not less than 1) module ahead of an inspection module to be used for a confirmation inspection, an inspection reservation signal to the inspection module.

A timing when a wafer W passes through the reference module includes a timing when the wafer W is transferred to the reference module by the main arm 26A or 26B or the conveying arm 4, or a timing when the wafer W is transferred from the reference module to the main arm 26A or 26B or the conveying arm 4. The timing when a confirmation wafer CW passes through the inspection reference module includes a timing when the confirmation wafer CW is transferred to the inspection reference module by the transfer arm 24, the conveying arm 4, or the main arm 26A or 26B, or a timing when the confirmation wafer CW is transferred from the inspection reference module to the transfer arm 24, the conveying arm 4, or the main arm 26A or 26B.

When the value of the integer n is too large, the number of steps for transferring a wafer from the reference module to the inspection module is increased, whereby a preparation period of the inspection module is elongated. On the other hand, when the value of the integer n is small, it is possible to inspect a product wafer W by the inspection module immediately after the trouble of the inspection module has been resolved, which will be described below. As described below, since a confirmation wafer CW is directly transferred from the carrier block 21 to the inspection block 40, the number of steps for transferring the confirmation wafer CW from the inspection reference module to the inspection module is naturally smaller. Thus, the integer n is preferably not less than 1 and not more than 10. More preferably, the integer n is not less than 1 and not more than 5, since it is preferable that an inspection reservation signal is outputted to an inspection module immediately before a product wafer W and a confirmation wafer CW is transferred to the inspection module.

The inspection exclusion button 56 serves as a selecting means. For example, when the button 56 is pressed, an inspection exclusion designation is performed, and when the button 56 is returned, the inspection exclusion designation is released. To perform an inspection exclusion designation means a case in which, after the trouble of an inspection module has been resolved, a confirmation wafer CW is preferentially transferred to the inspection module. After the inspection exclusion designation is performed, even when the trouble of the inspection module is resolved, an output of an inspection reservation signal for a product wafer W from the control part 100 is forbidden. When the inspection exclusion button 56 is returned, the inspection exclusion designation is released, so that the forbiddance of the output of an inspection reservation signal for a product wafer W is released. The case in which the inspection exclusion designation is not performed is a case in which, after the trouble of an inspection module has been resolved, a product wafer W is preferentially transferred to the inspection module.

The display part 57 can display an alarm signal from an inspection module, a trouble resolution signal, and a notice for completion of a confirmation inspection to a confirmation wafer CW. The confirmation inspection part 58 is a control means that performs a confirmation inspection of an inspection module, by outputting, when the trouble of the inspection module is resolved, a command for taking out a confirmation wafer CW from the carrier block 21 so as to transfer a confirmation wafer CW to the inspection module. The arm control part 59 is a means that controls the transfer arm 24, the conveying arm 4, the main arms 26A and 26B, and the interface arms 31 and 33.

Next, an operation of the present invention is described as applied to a case in which, for example, a predetermined inspection is performed to wafers W by the inspection module IM1.

Figure 5:
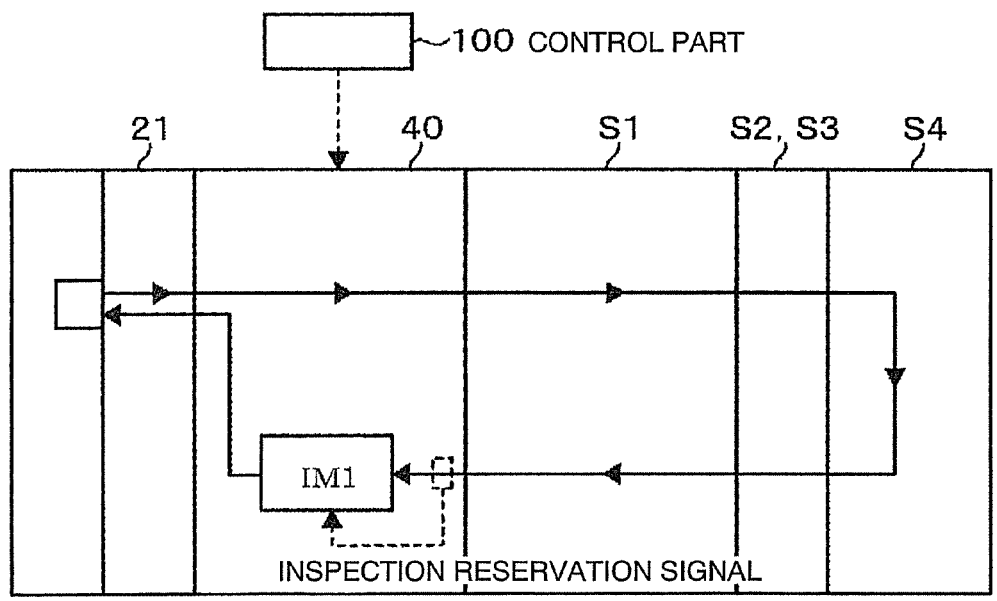
FIG. 5 is a view showing a transfer path in the coating and developing apparatus.

When the inspection of module IM1 is ordered, wafers W are transferred along a path shown in FIG. 5. At first, the carrier C1 is loaded into the carrier block 21 from outside. Then, the opening and closing part 23 is opened and the lid member of the carrier C1 is detached therefrom, and wafers W are taken out by the transfer arm 24. The wafers W are transferred to the transfer stage TRS1 by the transfer arm 24, and conveyed to the transfer stage TRS3 by the conveying arm 4 of the inspection block 40. Then, the wafers W are received by the main arm 26A from the transfer stage TRS3, and transferred by the main arms 26A and 26B, along a path from the cooling module CPL, the coating apparatus COT, the baking module PAB, to the cooling module CPL. in this order. Thereafter, the wafers W which have been coated with a resist liquid are sent to the first interface block S2.

In the first interface block S2, the wafers W are transferred to the peripheral exposure apparatus and the high-precision temperature adjusting module, and transferred to the second interface block B3 through the transfer stage of the shelf module 32B. Following thereto, the wafers W are transferred by the transfer arm 33 to the exposure apparatus S4 through the in-stage 34 of the exposure apparatus S4, and an exposure process is performed therein to the wafers W.

The wafers W which have been subjected to the exposure process are transferred to the out-stage 35, the second interface block S3, and the first interface block S2, in this order. Then, the wafers W are transferred to the baking module PEB (not shown) of the shelf module 25C of the process block S1 via the transfer arm 31. After that, the wafers W are transferred along a path from the cooling module CPL, the developing apparatus DEV, the heating module LHP, to the transfer stage TRS4, in this order. Then, a predetermined developing process is performed by the developing apparatus, whereby a predetermined resist pattern is formed.

Following thereto, the wafers W on the transfer stage TRS4 are received by the conveying arm 4 of the inspection block 40, and transferred to a predetermined inspection module (i.e., the inspection module IM1) of the inspection block 40. The same inspection is performed to product wafers W belonging to the same lot. At this time, when the first wafer in the lot passes through a reference module, for example, an inspection reservation signal is outputted from the inspection-reservation-signal outputting part 55 to the reservation-signal receiving part 41 of the inspection module IM1. In this example, the reference module is the transfer stage TRS4 which is a first module ahead of the inspection module IM1 in the transfer path. When the main arm 26A transfers the first wafer W to the transfer stage TRS4, an inspection reservation signal is outputted.

Thus, the inspection module IM1 performs a predetermined inspection to the product wafers W in an order of the receipt of the inspection reservation signals. Herein, an inspection reservation signal is outputted for each lot, the wafers W in the lot are sequentially subjected to a predetermined inspection in the received order of the inspection reservation signals of the lots. The wafers W which have been subjected to the inspection are transferred to the transfer stage TRS2 which is a destination next to the inspection module IM1. Thereafter, the wafers W are returned by the transfer arm 24 to the original carrier C1 of the carrier block 21.

Figure 6:
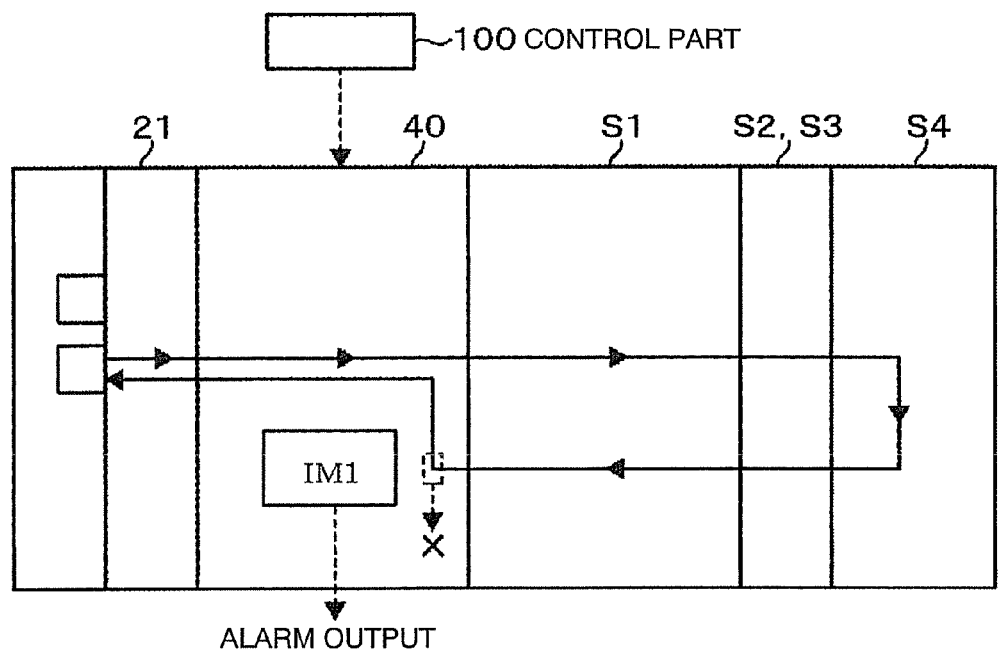
FIG. 6 is a view showing a transfer path in the coating and developing apparatus.

On the other hand, when the inspection module IM1 has a trouble, wafers W are transferred along a path shown in FIG. 6. In this case, when the inspection module IM1 has trouble, an alarm signal is outputted from the signal sending and receiving part 44 to the control part 100. Thus, the inspection-reservation-signal outputting part 55 of the control part 100 is forbidden to output an inspection reservation signal for a product wafer. Further, an operator judges whether to perform an inspection exclusion designation or not, and presses the inspection exclusion button 56 when the inspection exclusion designation is judged to be performed.

At first, there is described a case in which the inspection exclusion designation is performed. In this case, since the output of an inspection reservation signal for a product wafer from the control part 100 is forbidden, an inspection reservation signal is not outputted for a lot whose first wafer passes the reference module during when the output of an inspection reservation signal is forbidden. Regarding wafers W in the lot for which an inspection reservation signal has been already received by the inspection module IM1, a command is outputted to the conveying arm 4 such that the transfer of the wafers W to the inspection module IM1 is stopped, and that the wafers W are transferred to a next destination, i.e., the transfer stage TRS4 in this example (skip transfer). Regarding the wafers W in the lot for which an inspection reservation signal is forbidden to be outputted, the wafers W are also transferred in the skipping manner to the transfer stage TRS4 which is a destination next to the inspection module IM1.

Figure 7:
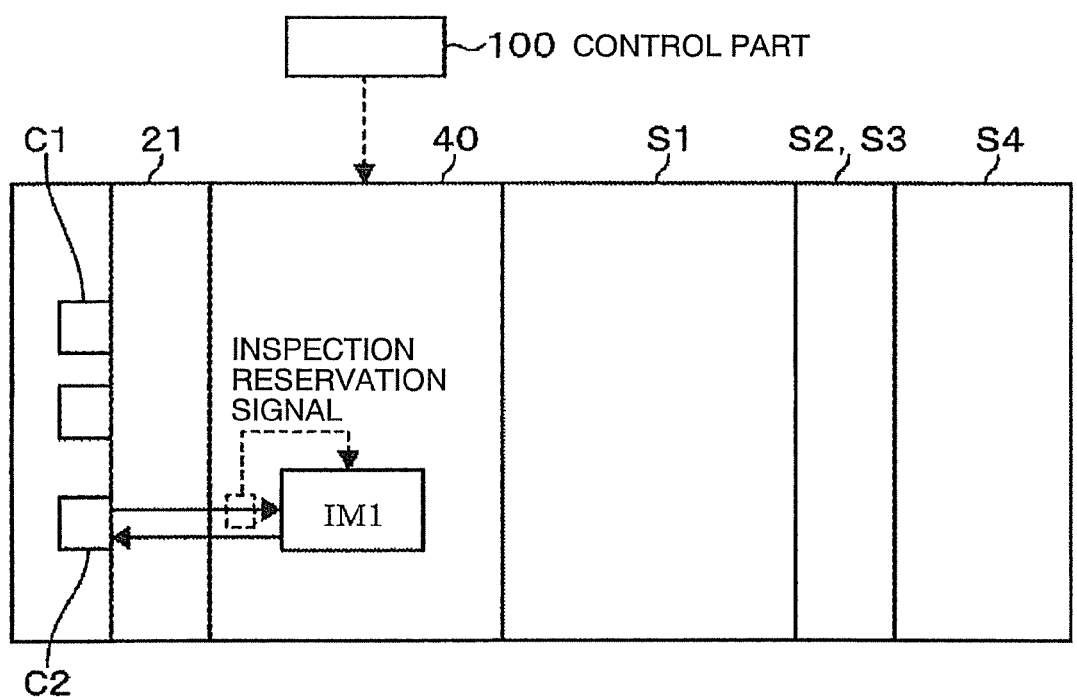
FIG. 7 is a view showing a transfer path in the coating and developing apparatus.

When the trouble of the inspection module IM1 is resolved, a trouble resolution signal is outputted from the signal sending and receiving part 44 of the inspection module IM1 to the control part 100. Based thereon, the confirmation inspection part 58 of the control part 100 outputs a command for taking out a confirmation wafer CW. A confirmation wafer CW is transferred along a path shown in FIG. 7, for example. Namely, the confirmation wafer CW is taken out by the transfer arm 24 from the carrier C2 of the carrier block 21, and placed on the transfer stage TRS1 of the inspection block 40. Then, the confirmation wafer CW is transferred by the conveying arm 4 to the inspection module IM1.

At this time, when the confirmation wafer CW passes through the transfer stage TRS1 which is an inspection reference module that is a first module ahead of the inspection module IM1 in this transfer path, an inspection reservation signal for the confirmation wafer CW is outputted from the inspection-reservation-signal outputting part 55 to the inspection module IM1. In this example, when the confirmation wafer CW is transferred to the transfer stage TRS1 by the transfer arm 24, an inspection reservation signal is outputted.

Under the state that the inspection exclusion designation is performed, the output of an inspection reservation signal for a product wafer is forbidden, which is as described above, the inspection reservation signal for the confirmation wafer CW is preferentially received by the inspection module IM1. Thus, the confirmation wafer CW can be promptly transferred to the inspection module IM1, without waiting for the wafers W in the other lots to be transferred, and subjected to a confirmation inspection by the inspection module IM1. The confirmation inspection is an inspection for confirming whether the inspection module IM1 is in order or not, by means of a predetermined inspection performed by the inspection module IM1 to the confirmation wafer CW. The confirmation wafer CW which has been subjected to the confirmation inspection is transferred along a path from the conveying arm 4, the transfer stage TRS2, the transfer arm 24, to the carrier C2 in this order, so as to be returned to the carrier block 21 from the inspection block 40.

After the confirmation inspection of the inspection module IM1 has been performed, the operator returns the inspection exclusion button 56 so as to release the inspection exclusion designation. Thus, the control part 100 releases the forbiddance of the output of an inspection reservation signal for a product wafer W. After the release of the output of an inspection reservation signal for a product wafer W, inspection reservation signals are outputted for lots whose first wafers are transferred to the reference module. Then, the product wafers W are sequentially transferred to the inspection module IM1 in an order of the receipt of the inspection reservation signals, and subjected to a predetermined inspection.

On the other hand, when the inspection exclusion designation is not judged to be performed, the operator does not press the inspection exclusion button 56. As described above, since the output of an inspection reservation signal for a product wafer from the control part 100 is forbidden, an inspection reservation signal is not outputted for a lot whose first wafer passes through the reference module during when the output of an inspection reservation signal is forbidden. Regarding wafers in a lot for which an inspection reservation signal has been already received by the inspection module IM1, the transfer of the wafers W to the inspection module IM1 is stopped, and the wafers are transferred in the skipping manner to a next destination, i.e., the transfer stage TRS4. Regarding the wafers W in a lot for which an inspection reservation signal is forbidden to be outputted, the wafers W are also transferred in the skipping manner to the transfer stage TRS4 that is a destination next to the inspection module IM1.

When the trouble of the inspection module IM1 is resolved, a trouble resolution signal is outputted from the inspection module IM1 to the control part 100. Based thereon, the control part 100 releases the forbiddance of the output of an inspection reservation signal for a product wafer W from the inspection-reservation-signal outputting part 55. Thus, inspection reservation signals are outputted for lots whose first wafers W pass through the reference module after the trouble has been resolved. The product wafers in the lots are transferred to the inspection module IM1 in an order of the receipt of the inspection reservation signals, and subjected to an inspection by the inspection module IM1.

Figure 8:
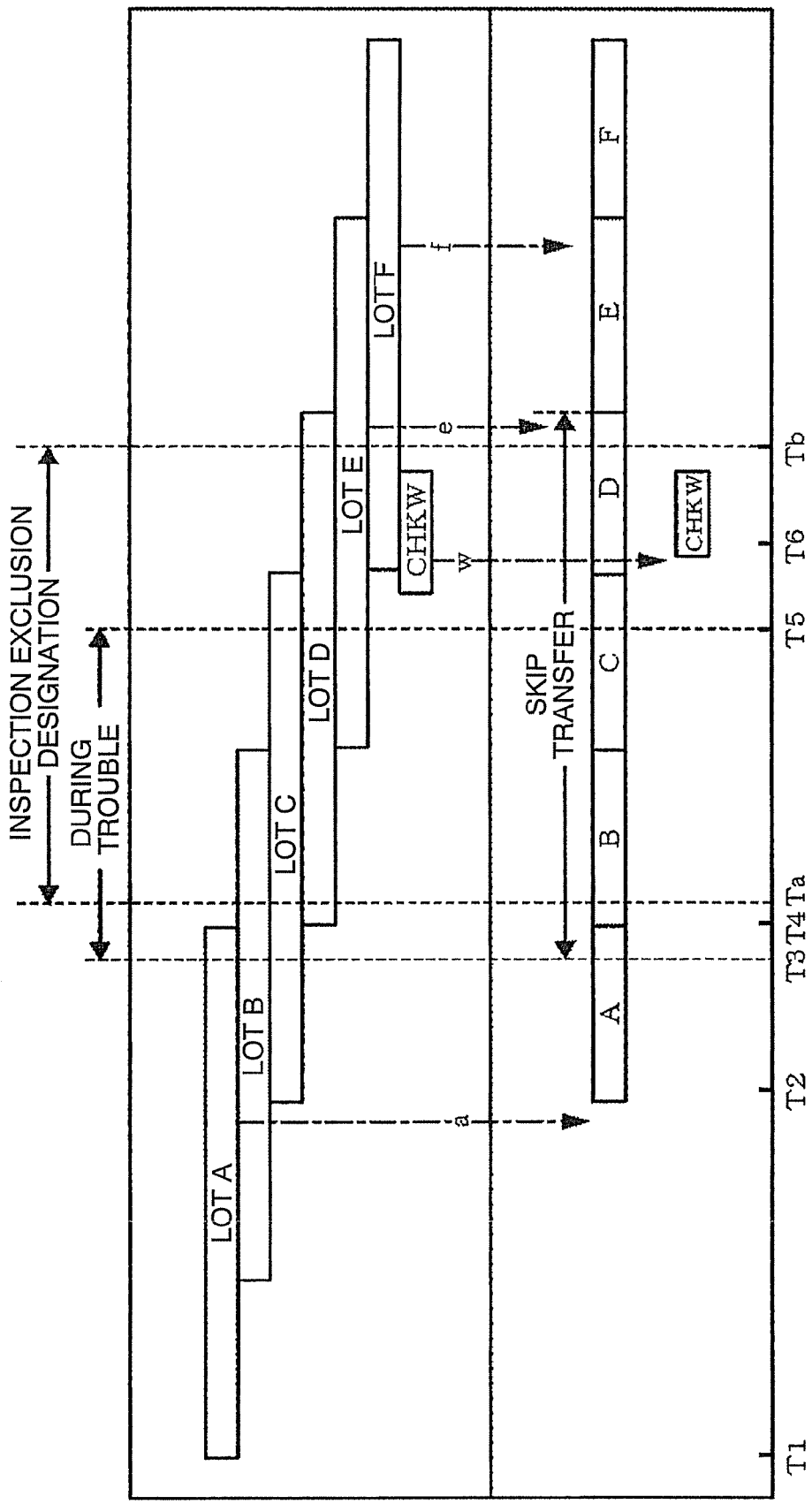
FIG. 8 is an explanatory view for explaining an operation of the coating and developing apparatus.
Figure 11:
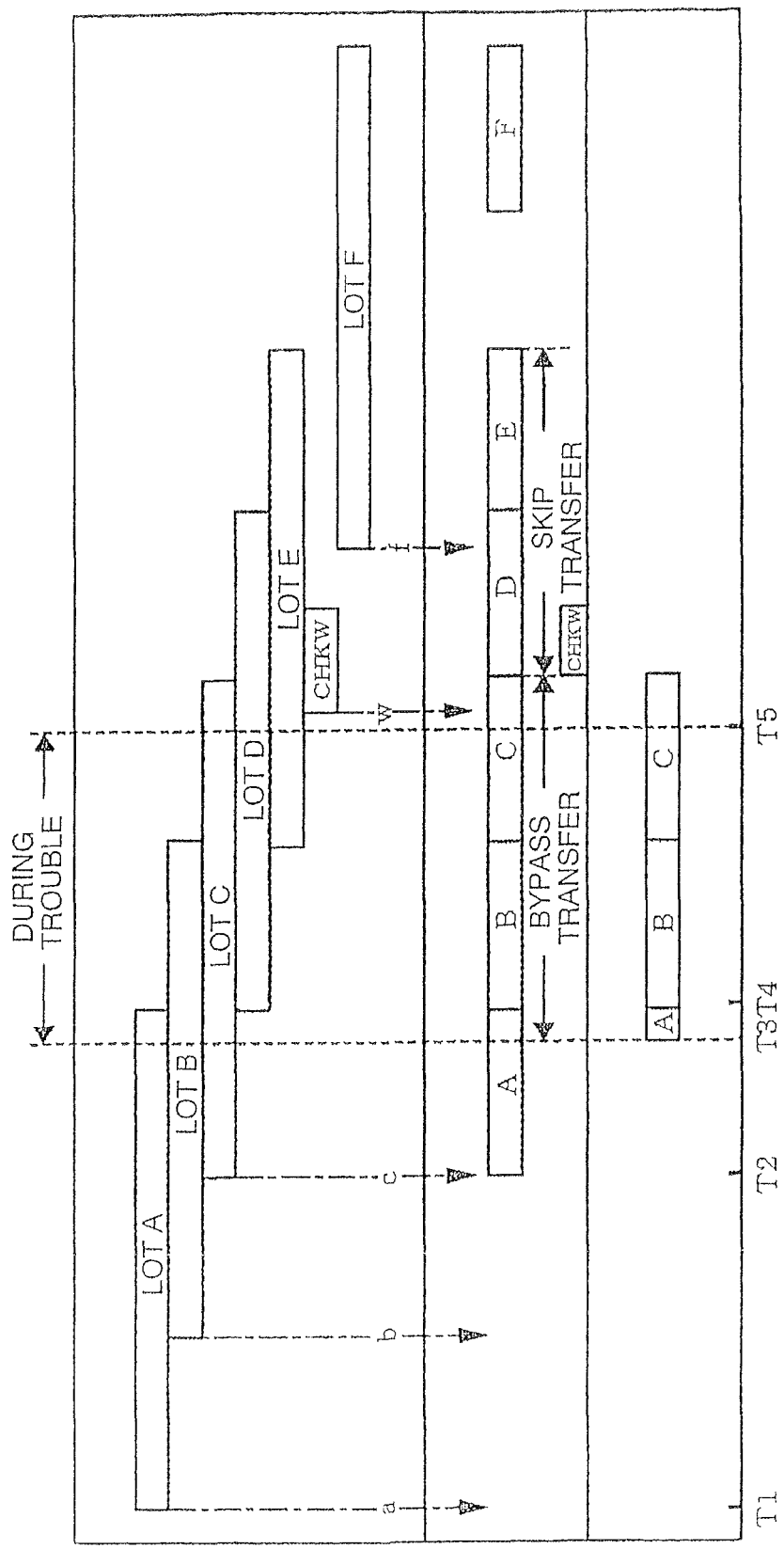
FIG. 11 is an explanatory view for explaining an operation of the conventional coating and developing apparatus.

The transfer of wafers W when the inspection exclusion designation is performed is described more concretely with reference to FIG. 8. Since FIG. 8 corresponds to FIG. 11 used for explaining the background art, differences of FIG. 8 from FIG. 11 are described. In FIG. 8, the horizontal axis shows the time points. The first row shows a timing at which a product wafer W is taken out from the carrier C1 in the carrier block 21 and the timing at which the wafer W is returned to the carrier C1. The second row shows a process condition of wafers in the inspection module IM1.

A difference from FIG. 11 in the first row is that an inspection reservation signal is outputted to the inspection module IM1 at a time point immediately before each of the lots A to F is transferred to the inspection module IM1 (i.e. at the time when a first wafer W in each lot is transferred to the transfer stage TRS 4 (reference module). Namely, regarding the lot A, an inspection reservation signal a is outputted immediately before the time point T2 at which a first wafer A1 of the lot A is transferred to the inspection module IM1.

In the second row, similarly to FIG. 11, a time point T3 is the time point when the inspection module IM1 has a trouble, and the time point T5 is a time point at which the trouble of the inspection module IMI is resolved and the inspection module IM1 becomes available. During this trouble, since the output of an inspection reservation signal from the control part 100 to the inspection module IMI is forbidden, an inspection reservation signal is not outputted for lot B, lot C, and lot D, whose first wafers pass through the transfer stage TRS4 during this period of time (the time between the time point T3 and the time point T5). A time point at which an operator presses the inspection exclusion button 56 so as to designate an inspection exclusion is the time point Ta. Since the operator judges whether to perform the inspection exclusion designation or not after the operator has found a trouble alarm, there is a slight time lag between the time at which the trouble occurs and the time at which the inspection exclusion designation is performed.

When the trouble is resolved at the time point T5, a trouble resolution signal is outputted from the inspection module IM1 to the control part 100. Based on a command for taking out a confirmation wafer CW, which is outputted from the control part 100, a confirmation wafer CW is taken out from the carrier block 21. Immediately before the confirmation wafer CW is transferred to the inspection module IM1, i.e., at a time point T6 at which the confirmation wafer CW is transferred to the transfer stage TRS1 (inspection reference module), an inspection reservation signal w for the confirmation wafer CW is outputted from the control part 100 to the inspection module IM1.

During when the inspection module IM1 is in trouble, since the output of an inspection reservation signal for a product wafer W from the control part 100 is forbidden, the inspection reservation signal w for the confirmation wafer is preferentially received by the inspection module IM1, following to the inspection reservation signal a for lot A. Thus, after the wafers W of the lot A have been transferred, the confirmation wafer CW can be promptly transferred to the inspection module IM1, without waiting for the other lots to be transferred.

Meanwhile, all the wafers W in lots B to D for which inspection reservation signals are not outputted, and wafers to be transferred to the inspection module IM1 after the trouble has occurred, are transferred in the skipping manner. Namely, these wafers are directly transferred from the process block S1 to the transfer stage TRS2 which is a destination next to the inspection module IM1.

When the confirmation inspection of the inspection module IM1 performed by using the confirmation wafer CW is completed, the notice is displayed on the display part 57, for example. Thus, the operator again presses the inspection exclusion button 56 so as to release the inspection exclusion designation. A time point Tb corresponds to the time point at which the inspection exclusion designation is released. At the time point Tb, the control part 100 releases the forbiddance of the output of an inspection reservation signal for a product wafer W. After the time point Tb, inspection reservation signals are outputted for lot E and lot F whose first wafers pass through the reference module. Then, the product wafers W of the lots E and F are sequentially transferred to the inspection module IM1, and subjected to an inspection by the inspection module IM1 in an order of the receipt of the inspection reservation signals.

According to this embodiment, whether to perform the inspection exclusion designation or not can be selected by an operator. Thus, it is possible to select, after the trouble of the inspection module IM1 has been resolved, whether a product wafer W is preferentially inspected by the inspection module IM1 or a confirmation wafer CW is firstly transferred thereto, whereby a degree of freedom in the process can be enhanced.

As described above, when the confirmation wafer CW is preferentially transferred, the inspection reservation signal w for the confirmation wafer CW is received by the inspection module IM1, such that the highest priority is given to the inspection reservation signal w after the trouble has occurred. Thus, immediately after the trouble of the inspection module IM1 is resolved, the confirmation inspection wafer can be promptly transferred to the inspection module IM1 so as to perform a confirmation inspection of the inspection module IM1. Therefore, a start time point at which the inspection module IM1 is used so as to resume an inspection after the confirmation inspection can be accelerated as compared with that of the conventional example shown in FIG. 11. Thus, product wafers W can be promptly transferred to the inspection module IM1. In this example, since an inspection by the inspection module IM1 can be started from the product wafers W of lot E, the number of product wafers W, which are not transferred to the inspection module IM1 but transferred to a next destination, can be decreased. Accordingly, the larger number of product wafer V can be inspected.

Next, another embodiment of the present invention will be described. In this embodiment, when a periodic inspection (maintenance), which is performed once per day, is performed to the overlapping inspection module IM3 that performs an overlapping inspection, an output of an inspection reservation signal for a product wafer W is forbidden, so that an inspection confirmation signal for a confirmation wafer CW is preferentially received, during this periodic inspection.

The periodic inspection is performed based on a command for performing a periodic inspection that is outputted once per day from the host computer 101 to the inspection module IM3 through the control part 100. During this periodic inspection, the inspection-reservation-signal outputting part 55 of the control part 100 is forbidden to output an inspection reservation signal for a product wafer. On the other hand, when the periodic inspection is performed, the inspection module IM3 outputs a confirmation inspection receivable signal to the control part 100 at a predetermined time. Based thereon, the confirmation inspection part 58 of the control part 100 outputs a command for taking out a confirmation wafer CW, so that a confirmation wafer CW is taken out from the carrier block 21 and transferred to the inspection module IM3. At a timing when the confirmation wafer CW is transferred to the transfer stage TRS1 (inspection reference module), an inspection reservation signal for the confirmation wafer CW is outputted. Then, a confirmation inspection is performed by using the confirmation wafer CW by the inspection module IM3. When the confirmation inspection using the confirmation wafer CW is completed, the periodic inspection is completed.

Upon completion of the periodic inspection, a periodic-inspection-completion signal is outputted from the inspection module IM3 to the control part 100. Based thereon, the inspection-reservation-signal outputting part 55 of the control part 100 is released from the forbiddance of the output of an inspection reservation signal for a product wafer. Thus, an inspection reservation signal is outputted for a lot whose first wafer W is transferred to the reference module after the completion of the periodic inspection.

During the periodic inspection of the inspection module IM3, even wafers W for which an inspection reservation signal has been already received by the inspection module IM3, and wafers W in the lot for which an inspection reservation signal is forbidden to be outputted, are transferred in the skipping manner to the transfer stage TRS2 as a next destination. During the skip transfer, since the product wafers W are transferred to the next destination without stopping at the inspection module IM3, the confirmation wafer CW can be transferred to the inspection module IM3 simultaneously when the product wafers W are transferred in the skipping manner. Therefore, the confirmation wafer CW can be immediately transferred to the inspection module IM3, without waiting for the other lots to be transferred, so that a confirmation inspection can be promptly performed.

Figure 9:
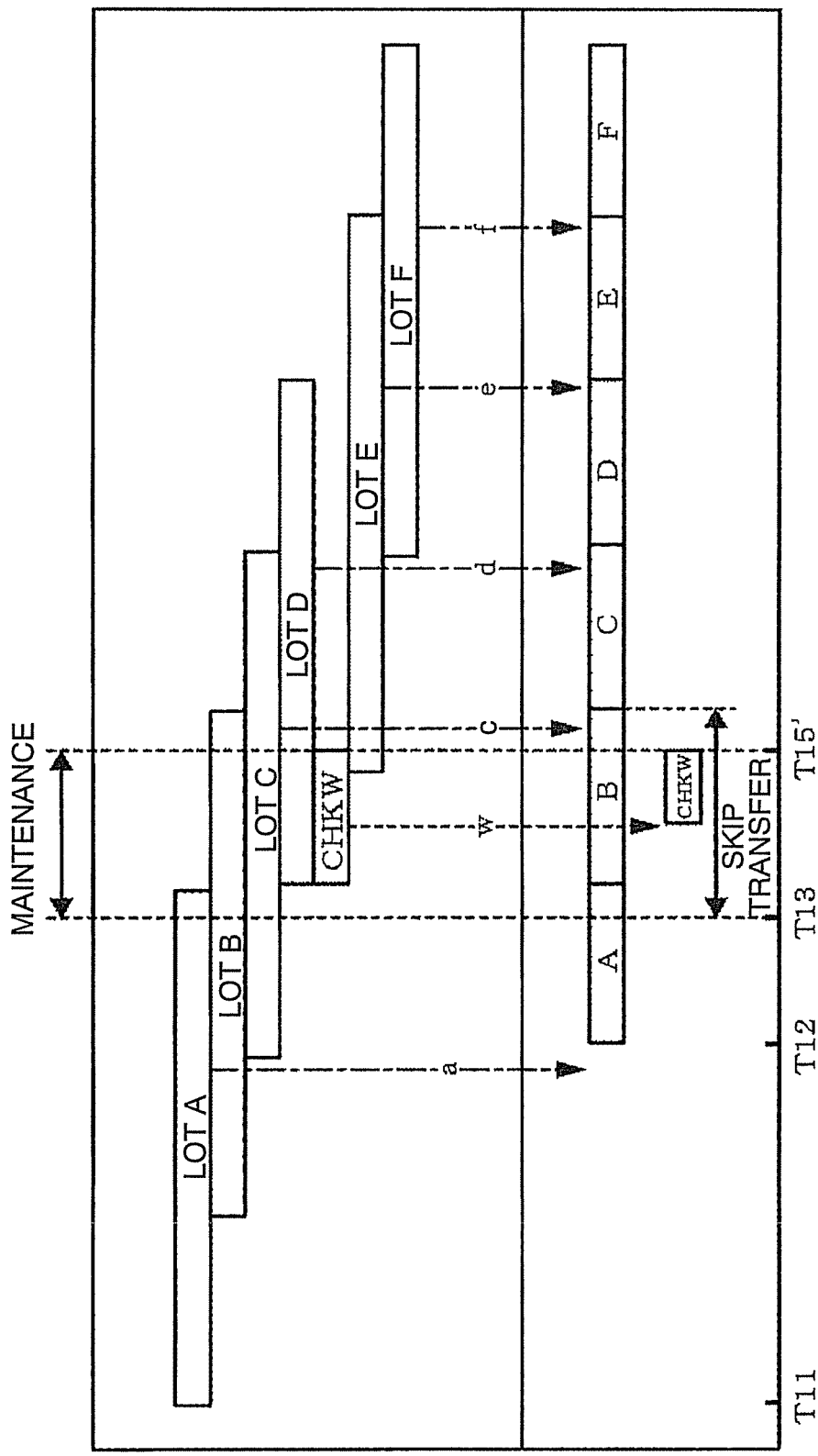
FIG. 9 is an explanatory view for explaining an operation of the coating and developing apparatus
Figure 10:
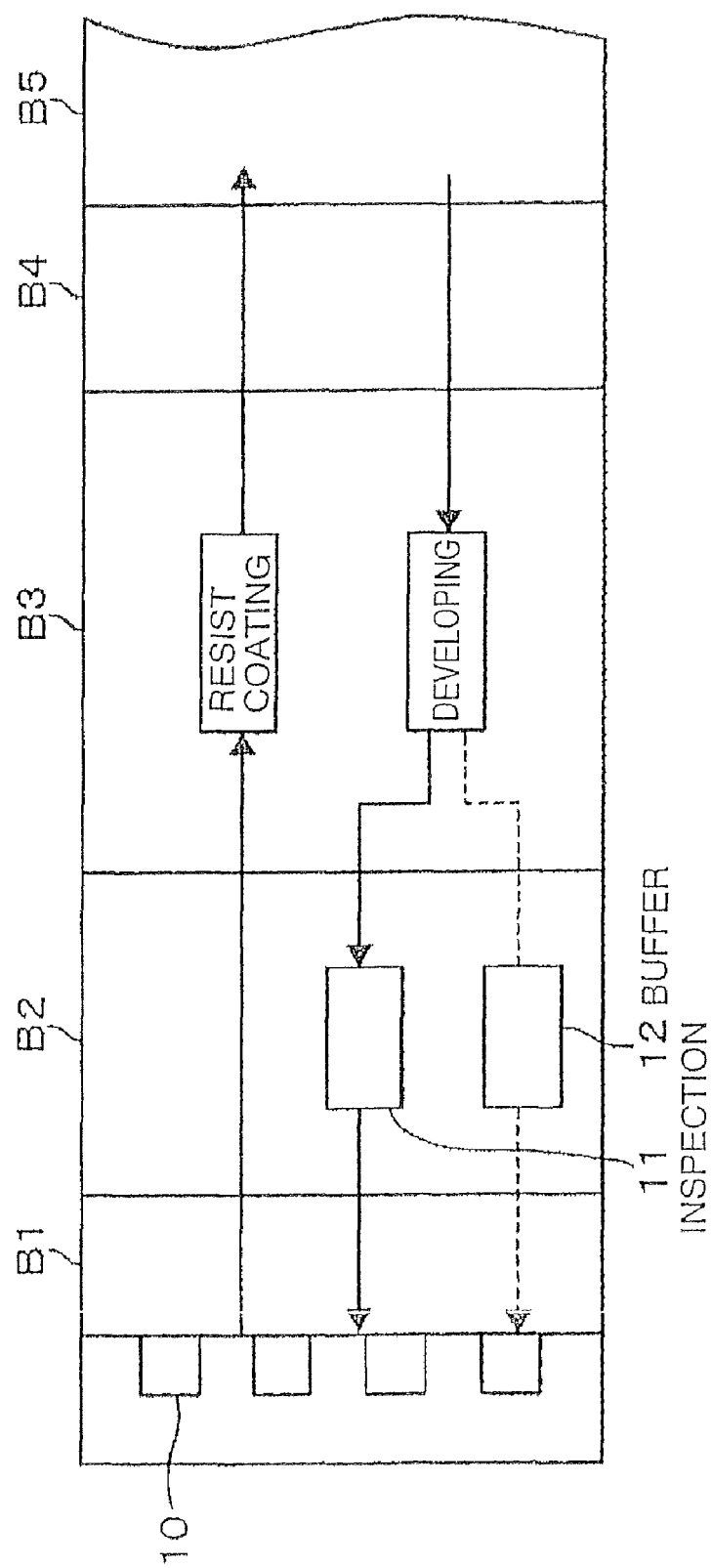
FIG. 10 is a schematic view showing a transfer path in a conventional coating and developing apparatus.
Figure 12:
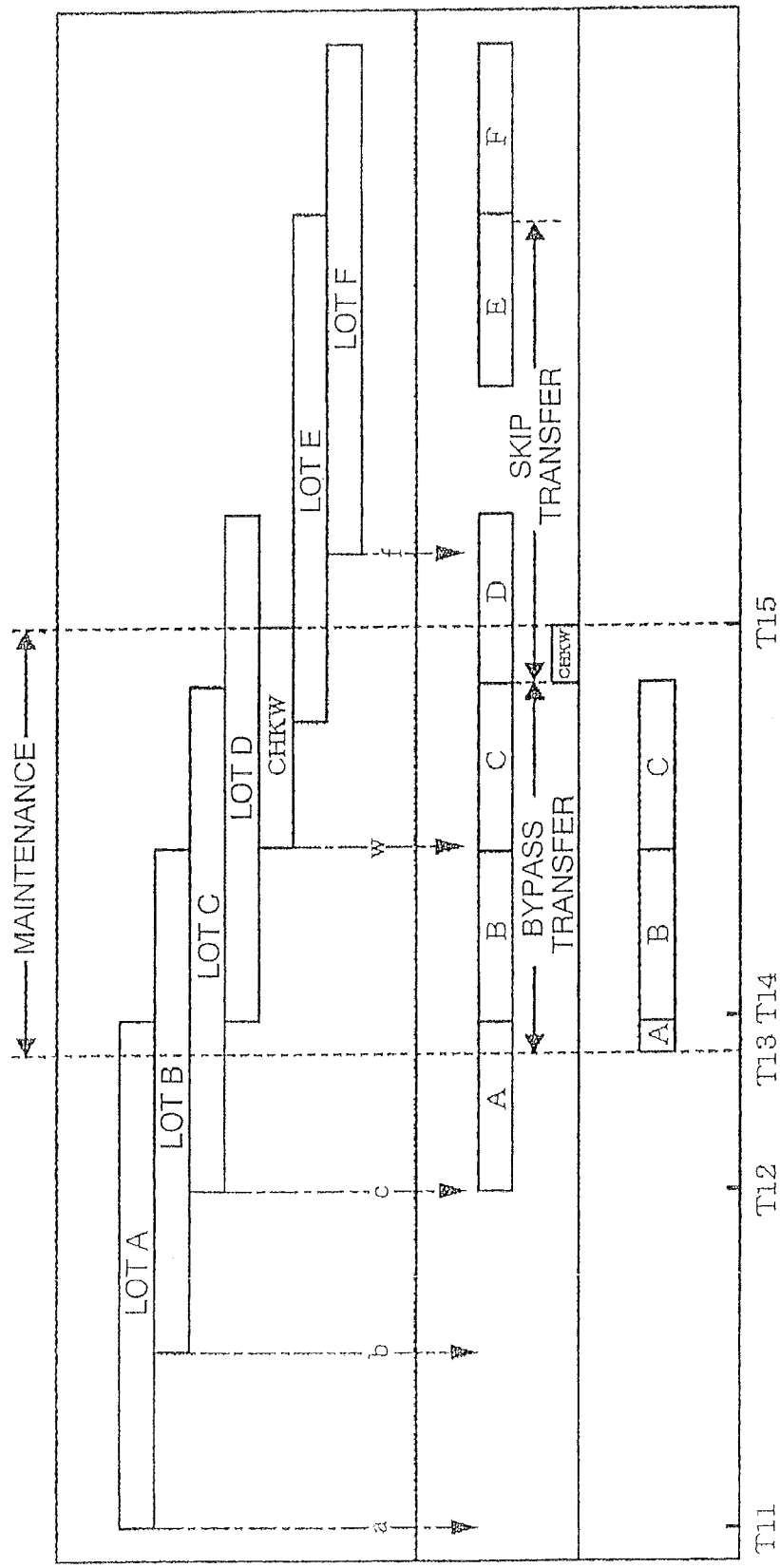
FIG. 12 is an explanatory view for explaining an operation of the conventional coating and developing apparatus.

This embodiment is described more concretely with reference to FIG. 9. Since FIG. 9 corresponds to FIG. 12 used for explaining the background art, differences of FIG. 9 from FIG. 12 are described. In FIG. 9, the horizontal axis shows the time points. The first row shows the timing at which a product wafer W is taken out from the carrier C1 in the carrier block 21. and the timing at which the wafer W is returned to the carrier C1. The second row shows a process condition of wafers in the inspection module IM3.

A difference from FIG. 12 in the first row is that an inspection reservation signal is outputted to the inspection module IM3 at a timing immediately before each of lots A to F are transferred to the inspection module IM3, (i.e., at the time when a first wafer W in each lot is transferred to the transfer stage TRS4 reference module). Namely, regarding, lot A, an inspection reservation signal a is outputted immediately before a time point T12 at which a first wafer A1 of the lot A is transferred to the inspection module IM3.

In the second row, similarly to FIG. 12, a time point T13 is the time point when a periodic inspection of the inspection module IM3 to be used is started, and a time point T15' is the time point at which the periodic inspection has been completed so that the inspection module IM3 becomes available. In this embodiment, during the periodic inspection of the inspection module IM3, since the output of an inspection reservation signal for a product wafer W is forbidden by the control part 100, an inspection reservation signal is not outputted for the lot B whose first wafer W is transferred to the reference module during this periodic information. When the periodic inspection makes progress to some degree, a confirmation-inspection receivable signal is outputted from the inspection module IM3 to the control part 100. Based on this signal, a confirmation wafer CW is taken out by a command from the confirmation inspection part 58 of the control part 100, and transferred to the inspection module IM3. At the time when the confirmation wafer CW is transferred to the transfer stage TRS1 (inspection reference module), an inspection signal w for the confirmation wafer CW is outputted from the control part 100 to the inspection module IM3. As described above, since the output of an inspection reservation signal for a product wafer W is forbidden during this periodic inspection, the inspection reservation signal w for the confirmation wafer CW is preferentially received by the inspection module IM3 following to the inspection reservation signal a for lot A. Thus, the confirmation wafer CW can be immediately transferred to the inspection module IM3, without waiting for the other lots to be transferred, and subjected to a confirmation inspection.

Meanwhile, all the wafers in the lot B for which an inspection reservation signal is forbidden to be outputted, and the remaining wafers of lot A for which an inspection reservation signal has been outputted so that the wafers are to be transferred to the inspection module IM3, are transferred in the skipping manner. Namely, these wafers are directly transferred to the transfer stage TRS2 which is a destination next to the inspection module IM3. Simultaneously with the skip transfer, the confirmation wafer CW is transferred to the inspection module IM3.

Then, when the confirmation inspection by using the confirmation wafer CW is completed, a confirmation inspection completion signal is outputted to the control part 100, so that the periodic inspection is completed. Then, the forbiddance of the output of an inspection reservation signal for a product wafer is released by the control part 100. Then, outputted to an inspection module IM3 are inspection reservation signals for the wafers W of lot C, lot D, lot E, and lot F whose first wafers are transferred to the reference module after this release. In the inspection module IM3, the product wafers W are inspected in an order of the receipt of the inspection reservation signals.

According to this embodiment, an inspection reservation signal is outputted immediately before a wafer is transferred to the inspection module IM3. During a periodic inspection of the inspection module IM3, an output of an inspection reservation signal for a product wafer is forbidden. in addition, simultaneously when product wafers W are transferred in the skipping manner, a confirmation wafer is transferred to the inspection module IM3 so as to be subjected to a confirmation inspection. Thus, immediately after the inspection module IM3 becomes capable of receiving the confirmation wafer CW, the confirmation inspection wafer CW can be promptly transferred to the inspection module IM3. Therefore, as compared with the conventional example, the time required for the periodic inspection can be reduced.

Accordingly, as compared with the conventional example, the number of product wafers W that are transferred in the skipping manner can be decreased, whereby the larger number of product wafers W can be inspected.

The above example is a case when wafers are inspected in the inspection block 40, by transferring the wafers along a path from the inspection module IM1, through the inspection module IM2, to the inspection module IM3, in this order. When the inspection module IM1 has the trouble, the wafers are transferred in the skipping manner to the inspection module IM2 which is a destination next to the inspection module IM1.

A storage part for storing a confirmation wafer CW is not limited to the carrier C2, and such a storage part may be formed of a buffer, and may be located in the inspection block 40 or the process block S1. Further, when an inspection exclusion designation is performed, the inspection exclusion designation may be performed before a trouble occurs. For example, the computer is programmed, to a time when a process is started, such that an inspection exclusion designation is performed when trouble occurs, and that the inspection exclusion designation is released when a confirmation inspection performed by the inspection module IM to a confirmation wafer CW is completed.

In the above embodiments, not limited to the above example, the coating and developing apparatus of the present invention has a structure in which a resist-coating block and a developing block are separated from each other. The position of the inspection block is also not limited to the above example. Moreover, the substrate in the present invention may be an FPD substrate, instead of a semiconductor wafer W.

The invention claimed is:
1. A coating and developing apparatus for processing a plurality of product substrates grouped in lots, the coating and developing apparatus comprising:
 a control part that controls the coating and developing apparatus;
 a carrier block on which a product carrier accommodating a plurality of product substrates is placed, the carrier block having a transfer means configured to transfer the substrates to and from a block adjacent to the carrier;
 a process block including: a plurality of modules including a module configured to perform a coating process for coating the product substrates, which have been transferred from the carrier block, with a resist, and a module configured to perform a developing process for developing the product substrates which have been coated with the resist and exposed; and a process substrate conveying means configured to transfer the product substrates to and from these modules;
 an inspection block including an inspection module configured to perform an inspection to the developed product substrates in an order of inspection reservations received by the inspection module, and an inspection substrate conveying means configured to transfer the substrates to and from the inspection module;

a storage part configured to accommodate a substrate for confirmation inspection used for confirming whether the inspection module is in order or not; and a selecting means by which an operator selects whether a product substrate or a substrate for confirmation inspection is transferred to the inspection module which had trouble, after the trouble has been resolved, wherein control part has a control means configured to control the transfer means and the inspection substrate conveying means, and wherein the control means performs:

a step in which, when the product substrate passes a reference module which is an n-th (n is an integer not less than 1) module ahead of the inspection module in a transfer path, an inspection reservation signal for performing an inspection to a lot to which the product substrate belongs is outputted to the inspection module;

a step in which, during when the inspection module is in trouble, the output of an inspection reservation signal for a product substrate is forbidden, and the product substrates to be transferred to the inspection module are transferred to a module which is next to the inspection module in a transfer order;

a step in which, when the trouble of the inspection module has been resolved and a product substrate is selected as a substrate to be transferred by the selecting means, the forbiddance of the output of an inspection reservation signal for a product substrate is released; and a step in which, when the trouble of the inspection module has been resolved and a substrate for confirmation inspection is selected as a substrate to be transferred by the selecting means, the substrate for confirmation inspection is unloaded from the storage part, an inspection reservation signal for the substrate for confirmation inspection is outputted, and after a confirmation inspection of the inspection module performed by using the substrate for confirmation inspection has been completed, the forbiddance of the output of an inspection reservation signal for a product substrate is released.

2. The coating and developing apparatus according to claim 1, wherein the inspection block is interposed between the carrier block and the process block.

3. The coating and developing apparatus according to claim 1, wherein the storage part is a carrier accommodating a substrate for confirmation inspection, and the carrier is placed on the carrier block.

4. The coating and developing apparatus according to claim 1, wherein the product substrate for which the inspection reservation signal is outputted when the product substrate passes the reference module is a first product substrate in a lot to which the product substrate belongs.

5. The coating and developing apparatus according to claim 1, wherein a timing when the product substrate passes the reference module is a timing when the product substrate is transferred from the process substrate conveying means or the inspection substrate conveying means to the reference module, or a timing when the product substrate is transferred from the reference module to the process substrate conveying means or the inspection substrate conveying means.

6. A coating and developing apparatus for processing a plurality of product substrates grouped in lots, the coating and developing apparatus comprising:

a control part that controls the coating and developing apparatus;

a carrier block on which a product carrier accommodating a plurality of product substrates is placed, the carrier block having a transfer means configured to transfer the substrates to and from a block adjacent to the carrier;

a process block including: a plurality of modules including a module configured to perform a coating process for coating the product substrates, which have been transferred from the carrier block, with a resist, and a module configured to perform a developing process for developing the product substrates which have been coated with the resist and exposed; and a process substrate conveying means configured to transfer the product substrates to and from these modules;

an inspection block including an inspection module configured to perform an inspection to the developed product substrates in an order of inspection reservations received by the inspection module, and an inspection substrate conveying means configured to transfer the substrates to and from the inspection module; and a storage part configured to accommodate a substrate for confirmation inspection used for confirming whether the inspection module is in order or not, wherein the control part has a control means configured to control the transfer means and the inpection substrate conveying means, and wherein the control part means performs:

a step in which, when the product substrate passes a reference module which is an n-th (n is an integer not less than 1) module ahead of the inspection module in a transfer path, an inspection reservation signal for performing an inspection to a lot to which the product substrate belongs is outputted to the inspection module;

a step in which, during when a periodic inspection of the inspection module is performed, the output of an inspection reservation signal for a product substrate is forbidden, and the product substrates to be transferred to the inspection module are transferred to a module which is next to the inspection module in a transfer order;

a step in which, before the periodic inspection of the inspection module is completed, a substrate for confirmation inspection is unloaded from the storage part and an inspection reservation signal for the substrate for confirmation inspection is outputted; and a step in which, after a confirmation inspection of the inspection module performed by using the substrate for confirmation inspection has been completed, the forbiddance of the output of an inspection reservation signal for a product substrate is released.

7. The coating and developing apparatus according to claim 6, wherein the inspection block is interposed between the carrier block and the process block.

8. The coating and developing apparatus according to claim 6, wherein the storage part is a carrier accommodating a substrate for confirmation inspection, and the carrier is placed on the carrier block.

9. The coating and developing apparatus according to claim 6, wherein the product substrate for which the inspection reservation signal is outputted when the product substrate passes the reference module is a first product substrate in a lot to which the product substrate belongs.

10. The coating and developing apparatus according to claim 6, wherein a timing when the product substrate passes the reference module is a timing when the product substrate is transferred from the process substrate conveying means or the inspection substrate conveying means to the reference module, or a timing when the product substrate is transferred from the reference module to the process substrate conveying means or the inspection substrate conveying means.

11. A method of controlling a coating and developing apparatus for processing a plurality of product substrates grouped in lots, the coating and developing method comprising: in a process block, a coating process for coating product substrates, which have been transferred from a carrier block, with a resist, and a developing process for developing the product substrates which have been coated with the resist and exposed; inspecting the developed product substrates in an inspection module, and returning the product substrates to the carrier block; and performing a confirmation inspection for confirming whether the inspection module is in order or not by using a substrate for confirmation inspection; the coating and developing method further comprising:

- a step in which, when a product substrate passes a reference module which is an n-th (n is an integer not less than 1) module ahead of the inspection module in a transfer path, an inspection reservation signal for performing an inspection to a lot to which the product substrate belongs is outputted to the inspection module;
- a step in which the inspection is performed in the inspection module to the product substrates in an order of the receipt of the inspection reservation signals;
- a step in which an operator selects whether a product substrate or a substrate for confirmation inspection is transferred to the inspection module which had trouble, after the trouble has been resolved;
- a step in which, during when the inspection module is in trouble, the output of an inspection reservation signal for a product substrate is forbidden, and the product substrates to be transferred to the inspection module are transferred to a module which is next to the inspection module in a transfer order;
- a step in which, when the trouble of the inspection module has been resolved and a product substrate is selected as a substrate to be transferred, the forbiddance of the output of an inspection reservation signal for a product substrate is released;
- a step in which, when the trouble of the inspection module has been resolved and a substrate for confirmation inspection is selected as a substrate to be transferred, an inspection reservation signal for the substrate for confirmation inspection is outputted, the substrate for confirmation inspection is transferred to the inspection module, and after a confirmation inspection of the inspection module has been completed, the forbiddance of the output of an inspection reservation signal for a product substrate is released.

12. A storage medium storing a computer program executable by a computer to perform a method of controlling a coating and developing apparatus for processing a plurality of product substrates grouped in lots, the coating and developing method comprising: in a process block, a coating process for coating product substrates, which have been transferred from a carrier block, with a resist, and a developing process for developing the product substrates which have been coated with the resist and exposed; inspecting the developed product substrates in an inspection module, and returning the product substrates to the carrier block; and performing a confirmation inspection for confirming whether the inspection module is in order or not by using a substrate for confirmation inspection; the coating and developing method further comprising:

- a step in which, when a product substrate passes a reference module which is an n-th (n is an integer not less than 1) module ahead of the inspection module in a transfer path, an inspection reservation signal for performing an inspection to a lot to which the product substrate belongs is outputted to the inspection module;
- a step in which the inspection is performed in the inspection module to the product substrates in an order of the receipt of the inspection reservation signals;
- a step in which an operator selects whether a product substrate or a substrate for confirmation inspection is transferred to the inspection module which had trouble, after the trouble has been resolved;
- a step in which, during when the inspection module is in trouble, the output of an inspection reservation signal for a product substrate is forbidden, and the product substrates to be transferred to the inspection module are transferred to a module which is next to the inspection module in a transfer order;
- a step in which, when the trouble of the inspection module has been resolved and a product substrate is selected as a substrate to be transferred, the forbiddance of the output of an inspection reservation signal for a product substrate is released;
- a step in which, when the trouble of the inspection module has been resolved and a substrate for confirmation inspection is selected as a substrate to be transferred, an inspection reservation signal for the substrate for confirmation inspection is outputted, the substrate for confirmation inspection is transferred to the inspection module, and after a confirmation inspection of the inspection module has been completed, the forbiddance of the output of an inspection reservation signal for a product substrate is released.

13. A method of controlling a coating and developing apparatus for processing a plurality of product substrates grouped in lots, the coating and developing method comprising: in a process block, a coating process for coating product substrates, which have been transferred from a carrier block, with a resist, and a developing process for developing the product substrates which have been coated with the resist and exposed; inspecting the developed product substrates in an inspection module, and returning the product substrates to the carrier block; and performing a confirmation inspection for confirming whether the inspection module is in order or not by using a substrate for confirmation inspection; the coating and developing method further comprising:

- a step in which, when the product substrate passes a reference module which is an n-th (n is an integer not less than 1) module ahead of the inspection module in a transfer path, an inspection reservation signal for performing an inspection to a lot to which the product substrate belongs is outputted to the inspection module;
- a step in which the inspection is performed in the inspection module to the product substrates in an order of the inspection reservation signals received by the inspection module;
- a step in which, during when a periodic inspection of the inspection module is performed, the output of an inspection reservation signal for a product substrate is forbidden, and the product substrates to be transferred to the inspection module are transferred to a module which is next to the inspection module in a transfer order;
- a step in which, before the periodic inspection of the inspection module is completed, an inspection reservation signal for a substrate for confirmation inspection is outputted and a substrate for confirmation inspection is unloaded from the storage part; and
- a step in which, after a confirmation inspection of the inspection module performed by using the substrate for confirmation inspection has been completed, the forbiddance of the output of an inspection reservation signal for a product substrate is released.

14. A storage medium storing a computer program executable by a computer to perform a method of controlling a coating and developing apparatus for processing a plurality of product substrates grouped in lots, the coating and developing method comprising: in a process block, a coating process for coating product substrates, which have been transferred from a carrier block, with a resist, and a developing process for developing the product substrates which have been coated with the resist and exposed; inspecting the developed product substrates in an inspection module, and returning the product substrates to the carrier block; and performing a confirmation inspection for confirming whether the inspection module is in order or not by using a substrate for confirmation inspection; the coating and developing method further comprising:

a step in which, when the product substrate passes a reference module which is an n-th (n is an integer not less than 1) module ahead of the inspection module in a transfer path, an inspection reservation signal for performing an inspection to a lot to which the product substrate belongs is outputted to the inspection module;

a step in which the inspection is performed in the inspection module to the product substrates in an order of the inspection reservation signals received by the inspection module;

a step in which, during when a periodic inspection of the inspection module is performed, the output of an inspection reservation signal for a product substrate is forbidden, and the product substrates to be transferred to the inspection module are transferred to a module which is next to the inspection module in a transfer order;

a step in which, before the periodic inspection of the inspection module is completed, an inspection reservation signal for a substrate for confirmation inspection is outputted and a substrate for confirmation inspection is unloaded from the storage part; and a step in which, after a confirmation inspection of the inspection module performed by using the substrate for confirmation inspection has been completed, the forbiddance of the output of an inspection reservation signal for a product substrate is released.

* * * * *